US012751189B2

(12) United States Patent
Hwang et al.

(10) Patent No.: US 12,751,189 B2
(45) Date of Patent: Sep. 29, 2026

(54) DISPLAY DEVICE

(71) Applicant: Samsung Display Co., LTD., Yongin-si (KR)

(72) Inventors: Jeongho Hwang, Yongin-si (KR); Eun-Kyung Yeon, Yongin-si (KR); Jungkyu Lee, Yongin-si (KR); Kyu-Ho Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 476 days.

(21) Appl. No.: 18/220,892

(22) Filed: Jul. 12, 2023

(65) Prior Publication Data

US 2024/0180009 A1 May 30, 2024

(30) Foreign Application Priority Data

Nov. 24, 2022 (KR) ........................ 10-2022-0159122

(51) Int. Cl.
*H10K 59/80* (2023.01)
*H10K 59/12* (2023.01)

(52) U.S. Cl.
CPC ..... *H10K 59/8792* (2023.02); *H10K 59/1201* (2023.02)

(58) Field of Classification Search
CPC ........................ H10K 59/8792; H10K 59/1201
USPC .......................................................... 313/500
See application file for complete search history.

(56) References Cited

U.S. PATENT DOCUMENTS 9,572,267 B2 2/2017 Cho
10,290,685 B2 5/2019 Oh et al.
10,658,615 B2 5/2020 Oh et al.
10,897,018 B2 1/2021 Jeon et al.
10,910,589 B2 2/2021 Jeong et al.
2019/0319201 A1* 10/2019 Goh .................... H10K 59/131
2021/0027667 A1* 1/2021 Lee .................. G02F 1/133305

FOREIGN PATENT DOCUMENTS

KR 101669026 B1 10/2016
KR 1020170132398 A 12/2017
KR 1020180098445 A 9/2018
KR 1020190100564 A 8/2019
KR 1020200069527 A 6/2020

OTHER PUBLICATIONS

K-PION Dossier of KR 10-20180098445 (Year: 2018).*

* cited by examiner

*Primary Examiner* — James R Greece
*Assistant Examiner* — Hana S Featherly
(74) *Attorney, Agent, or Firm* — CANTOR COLBURN LLP

(57) ABSTRACT

A display device includes: a display panel including a first portion, a second portion, and a bending portion disposed between the first portion and the second portion, a first black matrix disposed in the first portion and disposed adjacent to a boundary of the first portion, an anti-reflective layer disposed in the first portion to cover the first black matrix and extending to the bending portion, a second black matrix disposed on the anti-reflective layer, disposed adjacent to a boundary of the anti-reflective layer, and overlapping the first black matrix and the bending portion in a plan view, and a window disposed on the anti-reflective layer to cover the second black matrix.

16 Claims, 21 Drawing Sheets

DISPLAY DEVICE

This application claims priority to Korean Patent Application No. 10-2022-0159122, filed on Nov. 24, 2022, and all the benefits accruing therefrom under 35 U.S.C. § 119, the content of which in its entirety is herein incorporated by reference.

BACKGROUND

1. Field of Disclosure

The present disclosure relates to a display device.

2. Description of the Related Art

An electronic device that provides images to a user, such as a smart phone, a digital camera, a notebook computer, a navigation unit, and a smart television, include a display device to display the images. The display device generates the images and provides the images to the user through a display screen thereof.

The display device includes a display panel, and the display panel includes a driving chip and a plurality of pixels. The display panel includes a display area in which the pixels are arranged and a bending portion extending from the display area and defined therein.

An anti-reflective layer and a window are disposed on the display panel. The window is coated on the anti-reflective layer.

SUMMARY

The present disclosure provides a display device in which a bending protective layer disposed in the bending portion is covered by an anti-reflective layer.

Embodiments of the invention provide a display device including: a display panel including a first portion, a second portion, and a bending portion disposed between the first portion and the second portion, a first black matrix disposed in the first portion and disposed adjacent to a boundary of the first portion, an anti-reflective layer disposed in the first portion to cover the first black matrix and extending to the bending portion, a second black matrix disposed on the anti-reflective layer, disposed adjacent to a boundary of the anti-reflective layer, and overlapping the first black matrix and the bending portion when viewed in a plane, and a window disposed on the anti-reflective layer to cover the second black matrix.

Embodiments of the invention provide a display device including a display panel including a first portion, a second portion, and a bending portion disposed between the first portion and the second portion, an anti-reflective layer disposed in the first portion and extending to the bending portion, a window disposed on the anti-reflective layer, a bending protective layer disposed between the anti-reflective layer and the bending portion, and an adhesive layer disposed between the bending protective layer and the anti-reflective layer. The bending protective layer is separated from the anti-reflective layer when the bending portion is bent such that the second portion is disposed under the first portion.

Embodiments of the invention provide a method of manufacturing a display device. The method includes: preparing a display panel including a first portion, a second portion, and a bending portion disposed between the first portion and the second portion, providing a first black matrix in the first portion, providing a bending protective layer in the bending portion, providing an anti-reflective layer in the first portion and the bending portion, providing a second black matrix on the anti-reflective layer to overlap the first black matrix, and coating a window on the anti-reflective layer and the second black matrix. The second black matrix covers the first black matrix when viewed in a plane.

According to the above, the anti-reflective layer is disposed on an input sensing part and the bending protective layer. The anti-reflective layer extends from the first portion to the bending portion and overlaps the first portion and the bending portion. In addition, the adhesive layer is disposed between the anti-reflective layer and the bending protective layer. An adhesion between the bending protective layer and the adhesive layer is weaker than an adhesion between the anti-reflective layer and the adhesive layer. When the bending portion is bent, the anti-reflective layer and the bending protective layer are separated from each other. Accordingly, when viewed in a plane, the anti-reflective layer covers components disposed thereunder in the bending portion. Thus, a boundary between the bending portion and the first portion is effectively prevented from being perceived from outside in a bent state. In addition, as the anti-reflective layer extends to the bending portion, an area of the window coated on the anti-reflective layer increases.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
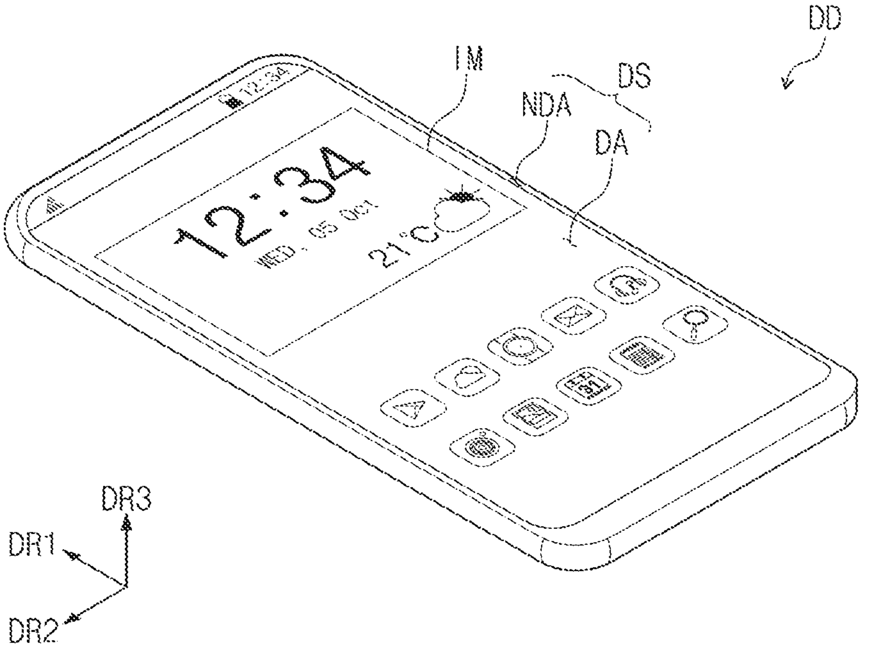
FIG. 1 is a perspective view of a display device according to an embodiment of the present disclosure.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be through and complete and will fully convey the invention to those skilled in the art, and the invention will only be defined by the appended claims. Like reference numerals denote like elements throughout the specification.

In the present disclosure, it will be understood that when an element or layer is referred to as being "on", "connected to" or "coupled to" another element or layer, it can be directly on, connected or coupled to the other element or layer or intervening elements or layers may be present. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments described in the disclosure are described with reference to plan views and cross-sectional views that are ideal schematic diagrams. Accordingly, shapes of the views may vary depending on manufacturing technologies and/or tolerances. Thus, embodiments are not limited to shown specific forms and also include variations in form produced according to manufacturing processes. Therefore, regions illustrated in the drawings are merely examples, and the shapes of the regions illustrated in the drawings are intended to illustrate the specific shapes of the regions of elements and not to limit the scope of the present disclosure.

Hereinafter, embodiments of the present disclosure will be described with reference to accompanying drawings.

FIG. 1 is a perspective view of a display device DD according to an embodiment of the present disclosure.

Referring to FIG. 1, the display device DD may have a rectangular shape defined by long sides extending in a first direction DR1 and short sides extending in a second direction DR2 crossing the first direction DR1. However, the shape of the display device DD should not be limited to the rectangular shape, and the display device DD may have various shapes, such as a circular shape and a polygonal shape.

Hereinafter, a direction substantially perpendicular to a plane defined by the first direction DR1 and the second direction DR2 may be referred to as a third direction DR3. In the present disclosure, the expression "when viewed in a plane" or "in a plan view" may mean a state of being viewed in the third direction DR3.

An upper surface of the display device DD may be referred to as a display surface DS, and the display surface DS may be a plane defined by the first direction DR1 and the second direction DR2. Images IM generated by the display device DD may be provided to a user through the display surface DS.

The display surface DS may include a display area DA and a non-display area NDA around the display area DA. The display area DA may display the images IM, and the non-display area NDA may not display the images IM. The non-display area NDA may surround the display area DA and may define an edge of the display device DD, which is printed by a predetermined color.

Figure 2:
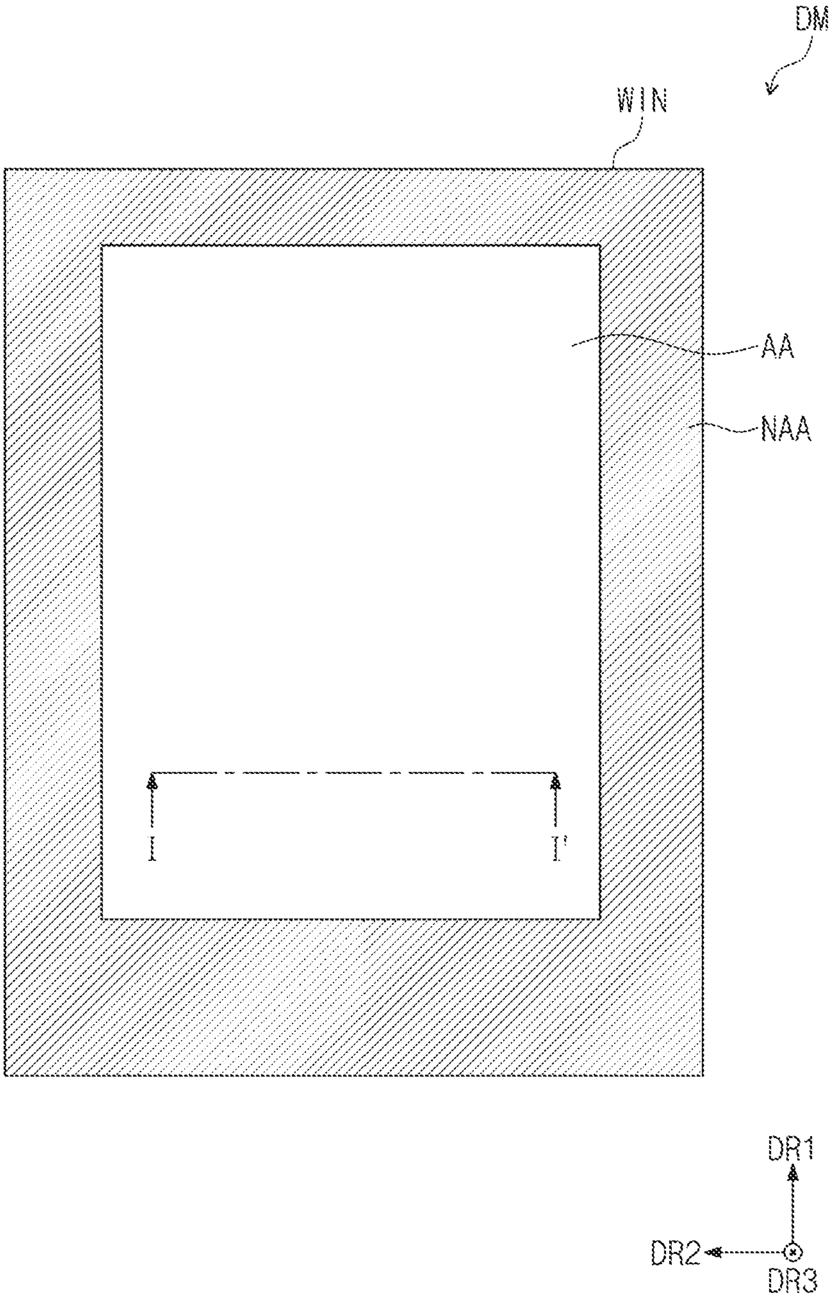
FIG. 2 is a view of a display module according to an embodiment of the present disclosure.
Figure 3:
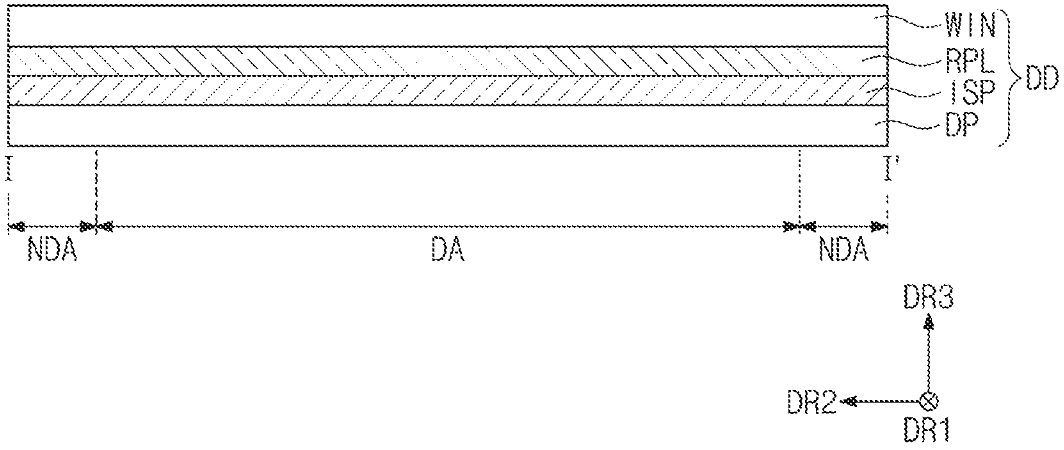
FIG. 3 is a cross-sectional view taken along a line I-I' of FIG. 1.

FIG. 2 is a view of a display module DM according to an embodiment of the present disclosure. FIG. 3 is a cross-sectional view taken along a line I-I' of FIG. 1.

As an example, FIG. 2 is a plan view, and FIG. 3 is a cross-sectional view of the display module DM shown in FIG. 2.

Referring to FIG. 2, the display module DM may have a rectangular shape defined by long sides extending in the first direction DR1 and short sides extending in the second direction DR2.

The display module DM may include an active area AA and a peripheral area NAA. The active area AA may be defined as an area from which the images IM displayed through the display module DM are emitted. The active area AA may overlap the display area DA of FIG. 1. The peripheral area NAA may surround the active area AA. The peripheral area NAA may overlap the non-display area NDA of FIG. 1.

Referring to FIGS. 2 and 3, the display module DM may include a display panel DP, an input sensing part ISP, an anti-reflective layer RPL, and a window WIN.

The display panel DP may be transparent. According to an embodiment, the display panel DP of FIG. 2 may be a light emitting type display panel, however, it should not be limited thereto or thereby. As another example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The input sensing part ISP may be disposed on the display panel DP. The input sensing part ISP may include a plurality of sensors (not shown) to sense an external input by a capacitive method. The input sensing part ISP may be directly manufactured on the display panel DP when the display module DM is manufactured, however, it should not be limited thereto or thereby. According to another embodiment, the input sensing part ISP may be attached to the display panel DP by an adhesive layer after being manufactured separately from the display panel DP.

The anti-reflective layer RPL may be disposed on the input sensing part ISP. The anti-reflective layer RPL may be directly formed on the input sensing part ISP or may be attached to the input sensing part ISP by an adhesive layer. The anti-reflective layer RPL may be defined as an external light reflection prevention film. The anti-reflective layer RPL may decrease a reflectance with respect to an external light incident to the display panel DP from the above of the display device DD.

In a case where the external light incident to the display panel DP is provided to the user after being reflected by the display panel DP, like a mirror, the user may perceive the external light. The anti-reflective layer RPL may include color filters that display the same colors as those of pixels to prevent the above-mentioned phenomenon.

The color filters may filter the external light such that the external light may have the same color as the pixels. In this case, the external light may not be perceived by the user. However, the present disclosure should not be limited thereto or thereby, and the anti-reflective layer RPL may include a polarizing film to reduce the reflectance with respect to the external light in another embodiment. The polarizing film may include a retarder and/or a polarizer.

The window WIN may be disposed on the anti-reflective layer RPL. The window WIN may be directly formed on the anti-reflective layer RPL or may be coupled to the anti-reflective layer RPL by an adhesive layer. The window WIN may protect the transparent display panel DP, the input sensing part ISP, and the anti-reflective layer RPL from external scratches and impacts.

Figure 4:
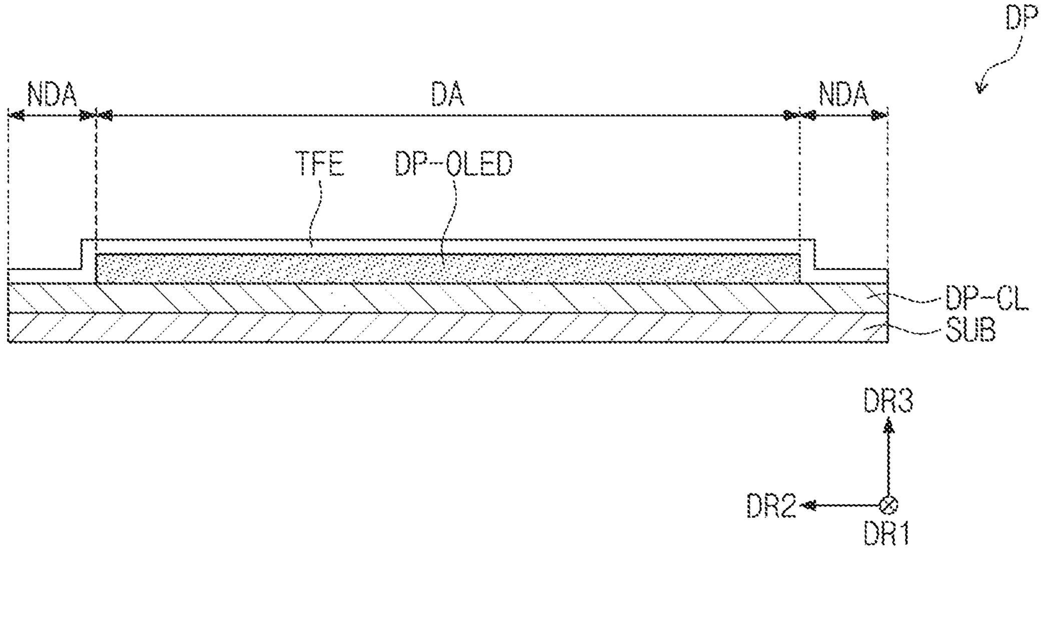
FIG. 4 is a cross-sectional view of a display panel shown in FIG. 3.

FIG. 4 is a cross-sectional view of the display panel DP shown in FIG. 3.

FIG. 4 shows a cross-section of the display panel DP when viewed in the first direction DR1 as a representative example.

Referring to FIG. 4, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include glass or a flexible plastic material, e.g., polyimide ("PI"). The display element layer DP-OLED may be disposed in the display area DA.

A plurality of pixels may be disposed in the circuit element layer DP-CL and the display element layer DP-OLED. Each of the pixels may include a transistor disposed in the circuit element layer DP-CL and a light emitting element disposed in the display element layer DP-OLED and connected to the transistor. The pixel will be described in detail with reference to FIG. 7.

The thin film encapsulation layer TFE may be disposed on the circuit element layer DP-CL to cover the display element layer DP-OLED. The thin film encapsulation layer TFE may protect the pixels from moisture, oxygen, and foreign substances.

Figure 5:
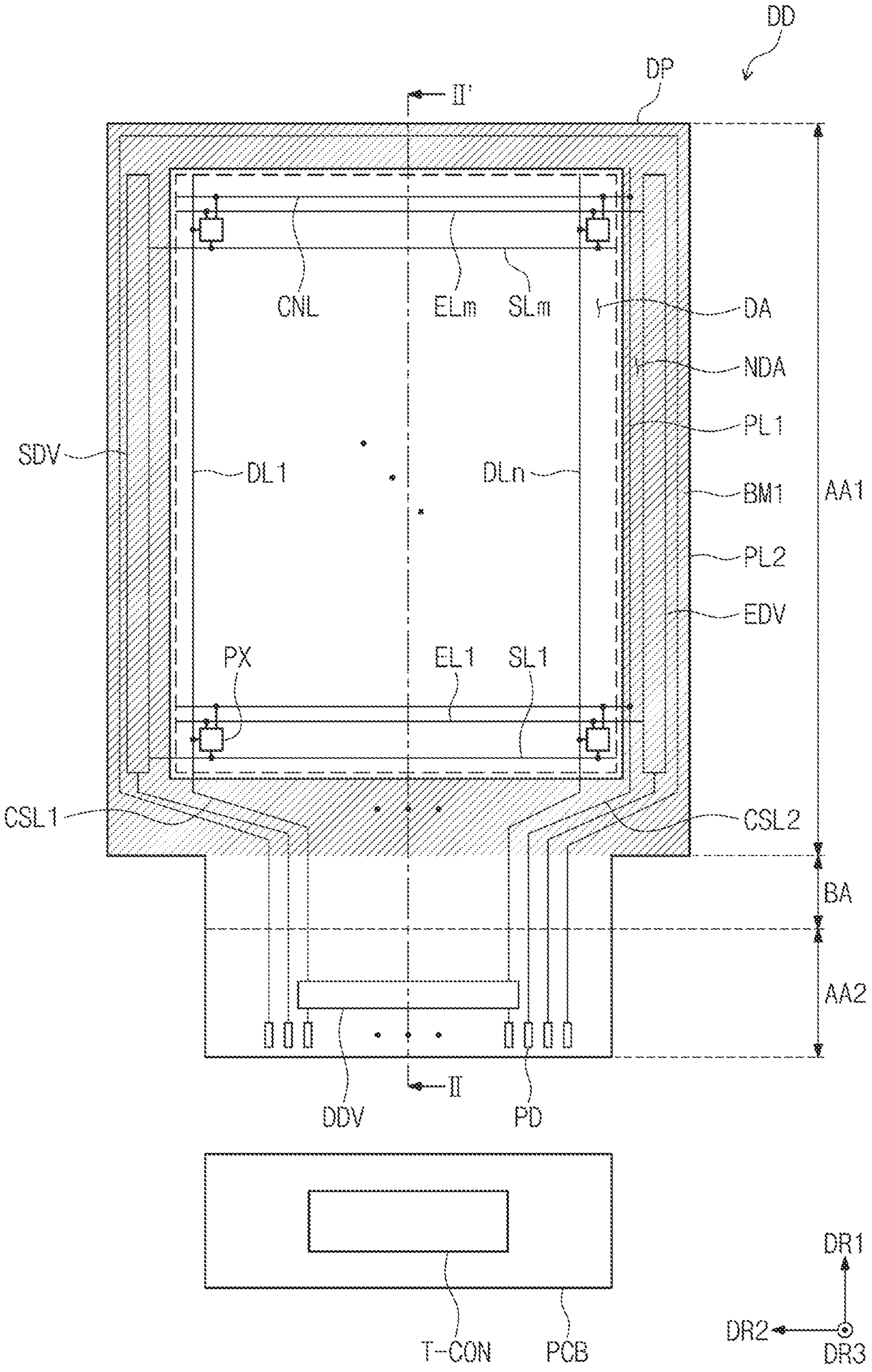
FIG. 5 is a plan view of the display panel shown in FIG. 4.

FIG. 5 is a plan view of the display panel DP shown in FIG. 4.)

Referring to FIG. 5, the display device DD may include the display panel DP, a first black matrix BM1, a scan driver SDV, a data driver DDV, an emission driver EDV, a printed circuit board PCB, and a timing controller T-CON.

The display panel DP may include a first portion AA1, a second portion AA2, and a bending portion BA disposed between the first portion AA1 and the second portion AA2. The first portion AA1, the bending portion BA, and the second portion AA2 may be arranged in the first direction DR1, the bending portion BA may extend in the second direction DR2. The bending portion BA may extend from the first portion AA1 to the first direction DR1, and the second portion AA2 may extend from the bending portion BA to the first direction DR1.

The first portion AA1 may include long sides extending in the first direction DR1 and spaced apart from each other in the second direction DR2. The bending portion BA and the second portion AA2 may have a length shorter than a length of the first portion AA1 in the second direction DR2.

The first portion AA1 may include the display area DA and the non-display area NDA around the display area DA. The non-display area NDA may surround the display area DA. The display area DA may be an area in which an image is displayed, and the non-display area NDA may be an area in which an image is not displayed. The second portion AA2 and the bending portion BA may be areas in which an image is not displayed.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, a plurality of connection lines CNL, and a plurality of pads PD. Each of m and n is a natural number. The pixels PX may be arranged in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA to be adjacent to the long sides of the first portion AA1, respectively. The data driver DDV may be disposed in the second portion AA2.

The data driver DDV may be manufactured in an integrated circuit chip form and may be mounted on the second portion AA2. The data driver DDV may be defined as a driving IC.

The scan lines SL1 to SLm may extend in the second direction DR2 and may be connected to the scan driver SDV. The data lines DL1 to DLn may extend in the first direction DR1 and may be connected to the data driver DDV via the bending portion BA. The emission lines EL1 to ELm may extend in the second direction DR2 and may be connected to the emission driver EDV.

The first power line PL1 may extend in the first direction DR1 and may be disposed in the non-display area NDA. The first power line PL1 may be disposed between the display area DA and the emission driver EDV, however, it should not be limited thereto or thereby. According to another embodiment, the first power line PL1 may be disposed between the display area DA and the scan driver SDV.

The first power line PL1 may extend to the bending portion BA. When viewed in a plane, the first power line PL1 may extend to a lower end of the second portion AA2. The first power line PL1 may receive a first voltage.

The second power line PL2 may be disposed in the non-display area NDA facing the second portion AA2 with the display area DA interposed therebetween and the non-display area NDA adjacent to the long sides of the first portion AA1. The second power line PL2 may be disposed outside the scan driver SDV and the emission driver EDV.

The second power line PL2 may extend toward the second portion AA2 via the bending portion BA. Portions of the second power line PL2, which are disposed in the second portion AA2, may be spaced apart from each other with the data driver DDV interposed therebetween and may extend in the first direction DR1. The second power line PL2 may extend to the lower end of the second portion AA2 when viewed in the plane.

The second power line PL2 may receive a second voltage having a level lower than a level of the first voltage. Although not shown in figures for the convenience of explanation, the second power line PL2 may extend toward the display area DA and may be connected to the pixels PX, and the second voltage may be applied to the pixels PX via the second power line PL2.

The connection lines CNL may extend in the second direction DR2 and may be arranged in the first direction DR1. The connection lines CNL may be connected to the first power line PL1 and the pixels PX. The first voltage may be applied to the pixels PX via the first power line PL1 and the connection lines CNL connected to the first power line PL1.

The first control line CSL1 may be connected to the scan driver SDV and may extend toward the lower end of the second portion AA2 via the bending portion BA. The second control line CSL2 may be connected to the emission driver EDV and may extend toward the lower end of the second portion AA2 via the bending portion BA. The data driver DDV may be disposed between the first control line CSL1 and the second control line CSL2.

When viewed in the plane, the pads PD may be disposed adjacent to the lower end of the second portion AA2. The data driver DDV, the first power line PL1, the second power line PL2, the first control line CSL1, and the second control line CSL2 may be connected to the pads PD.

The data lines DL1 to DLn may be connected to corresponding pads PD via the data driver DDV. As an example, the data lines DL1 to DLn may be connected to the data driver DDV, and the data driver DDV may be connected to the pads PD corresponding to the data lines DL1 to DLn.

The printed circuit board PCB may be connected to the pads PD, and the timing controller T-CON may be disposed on the printed circuit board PCB. The timing controller T-CON may be mounted on the printed circuit board PCB after being manufactured in an integrated circuit chip form. The timing controller T-CON may be connected to the pads PD via the printed circuit board PCB.

Although not shown in figures, the display device DD may further include a voltage generator to generate the first voltage and the second voltage. The voltage generator may be connected to the pads PD connected to the first and second power lines PL1 and PL2.

The timing controller T-CON may control an operation of the scan driver SDV, the data driver DDV, and the emission driver EDV. The timing controller T-CON may generate a scan control signal, a data control signal, and an emission control signal in response to control signals applied thereto from the outside.

The scan control signal may be applied to the scan driver SDV via the first control line CSL1. The emission control signal may be applied to the emission driver EDV via the second control line CSL2. The data control signal may be applied to the data driver DDV. The timing controller T-CON may receive image signals from the outside, may convert a data format of the image signals to a data format appropriate to an interface between the timing controller T-CON and the data driver DDV, and may provide the converted image signals to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

The first black matrix BM1 may be disposed in the first portion AA1. The first black matrix BM1 may surround the display area DA. The first black matrix BM1 will be described in detail with reference to FIG. 7A.

Figure 6:
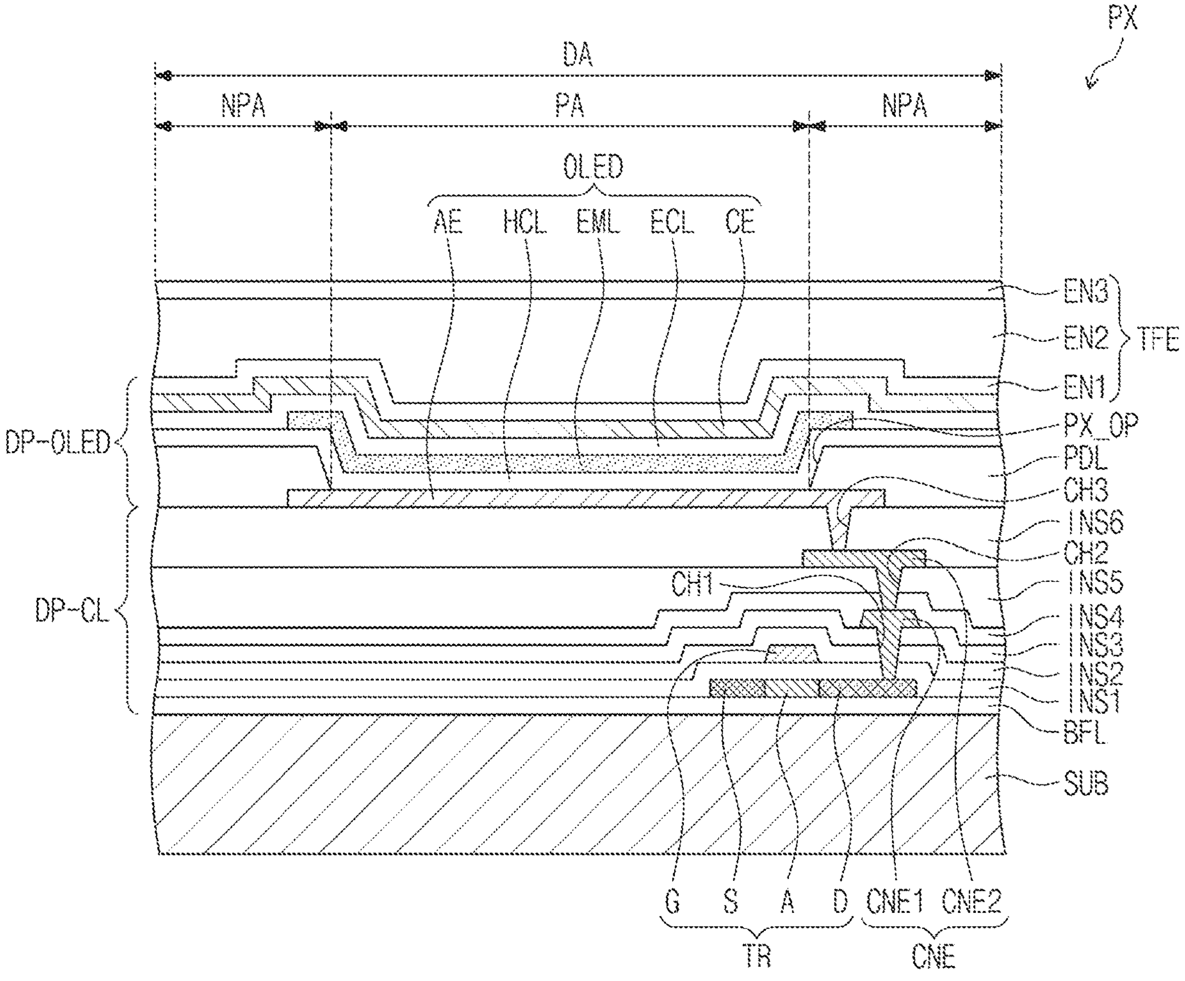
FIG. 6 is a cross-sectional view of a pixel shown in FIG. 5.

FIG. 6 is a cross-sectional view of the pixel PX shown in FIG. 5.

Referring to FIG. 6, the pixel PX may include a transistor TR and a light emitting element OLED. The light emitting element OLED may include a first electrode (or an anode) AE, a second electrode (or a cathode) CE, a hole control layer HCL, an electron control layer ECL, and a light emitting layer EML.

The transistor TR and the light emitting element OLED may be disposed on the substrate SUB. As an example, one transistor TR is shown in FIG. 6, however, the pixel PX may include a plurality of transistors and at least one capacitor to drive the light emitting element OLED.

The display area DA may include a light emitting area PA corresponding to each pixel PX and a non-light-emitting area NPA around the light emitting area PA. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polycrystalline silicon, amorphous silicon, or metal oxide.

The semiconductor pattern may be doped with an N-type dopant or a P-type dopant. The semiconductor pattern may include a high-doped region and a low-doped region. The high-doped region may have a conductivity greater than a conductivity of the low-doped region and may substantially serve as a source electrode and a drain electrode of the transistor TR. The low-doped region may substantially correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR to the light emitting element OLED. The first connection electrode CNE1 may be disposed on the third insulating layer INS3 and may be connected to the drain D through a first contact hole CH1 defined through the first, second, and third insulating layers INS1, INS2, and INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined through the fourth insulating layer INS4 and the fifth insulating layer INS5.

A sixth insulating layer INS6 may be disposed on the second connection electrode CNE2. Each layer from the buffer layer BFL to the sixth insulating layer INS6 may be defined as the circuit element layer DP-CL. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 defined through the sixth insulating layer INS6. A pixel definition layer PDL may be disposed on the first electrode AE and the sixth insulating layer INS6. The pixel definition layer PDL may be provided with an opening PX_OP defined therethrough to expose a portion of the first electrode AE.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area PA and the non-light-emitting area NPA.

The second electrode CE may be disposed on the electron control layer ECL. The second electrode CE may be commonly disposed over the pixels PX. A combination of layers for the light emitting element OLED may be referred to as the display element layer DP-OLED.

The thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include an inorganic insulating layer and may protect the pixel PX from moisture and oxygen. The second encapsulation layer EN2 may include an organic insulating layer and may protect the pixel PX from a foreign substance such as dust particles.

The first voltage may be applied to the first electrode AE via the transistor TR, and the second voltage having the level lower than the first voltage may be applied to the second electrode CE. Holes and electrons injected into the light emitting layer EML may be recombined to generate excitons, and the light emitting element OLED may emit the light by the excitons that return to a ground state from an excited state.

Figure 7A:
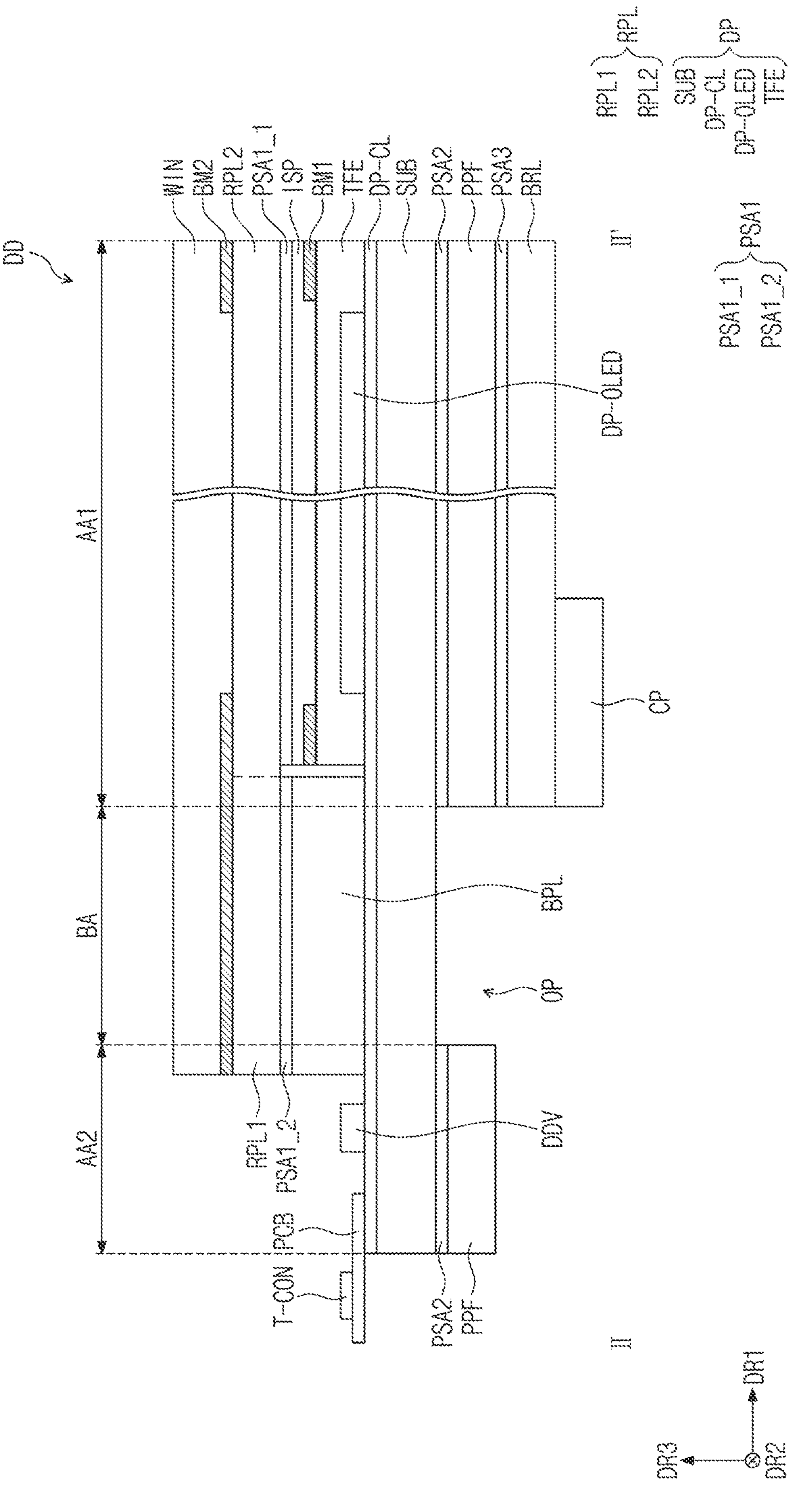
FIGS. 7A to 7C are cross-sectional views taken along a line II-II' of FIG. 5.
Figure 7B:
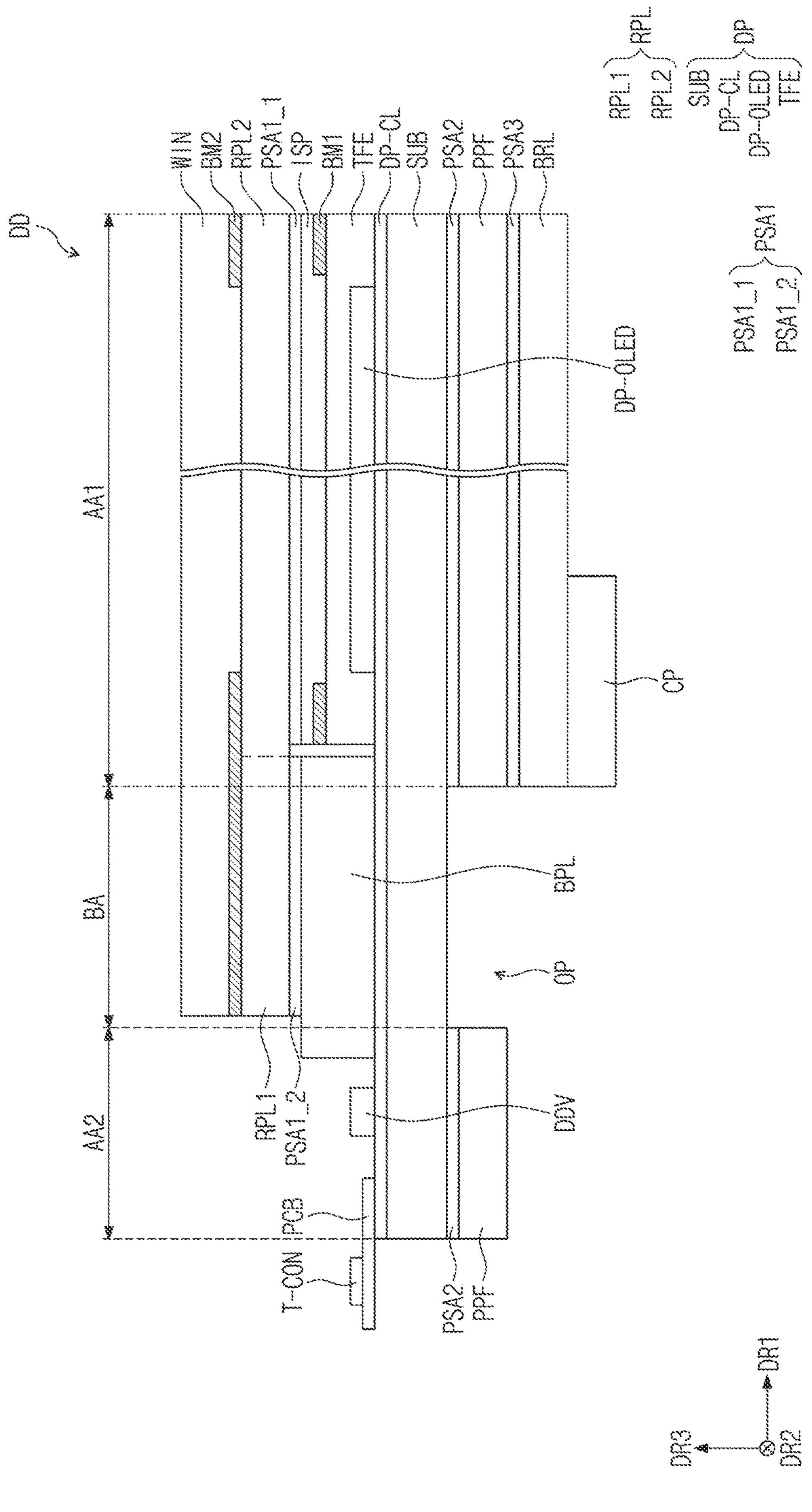
Figure 7C:
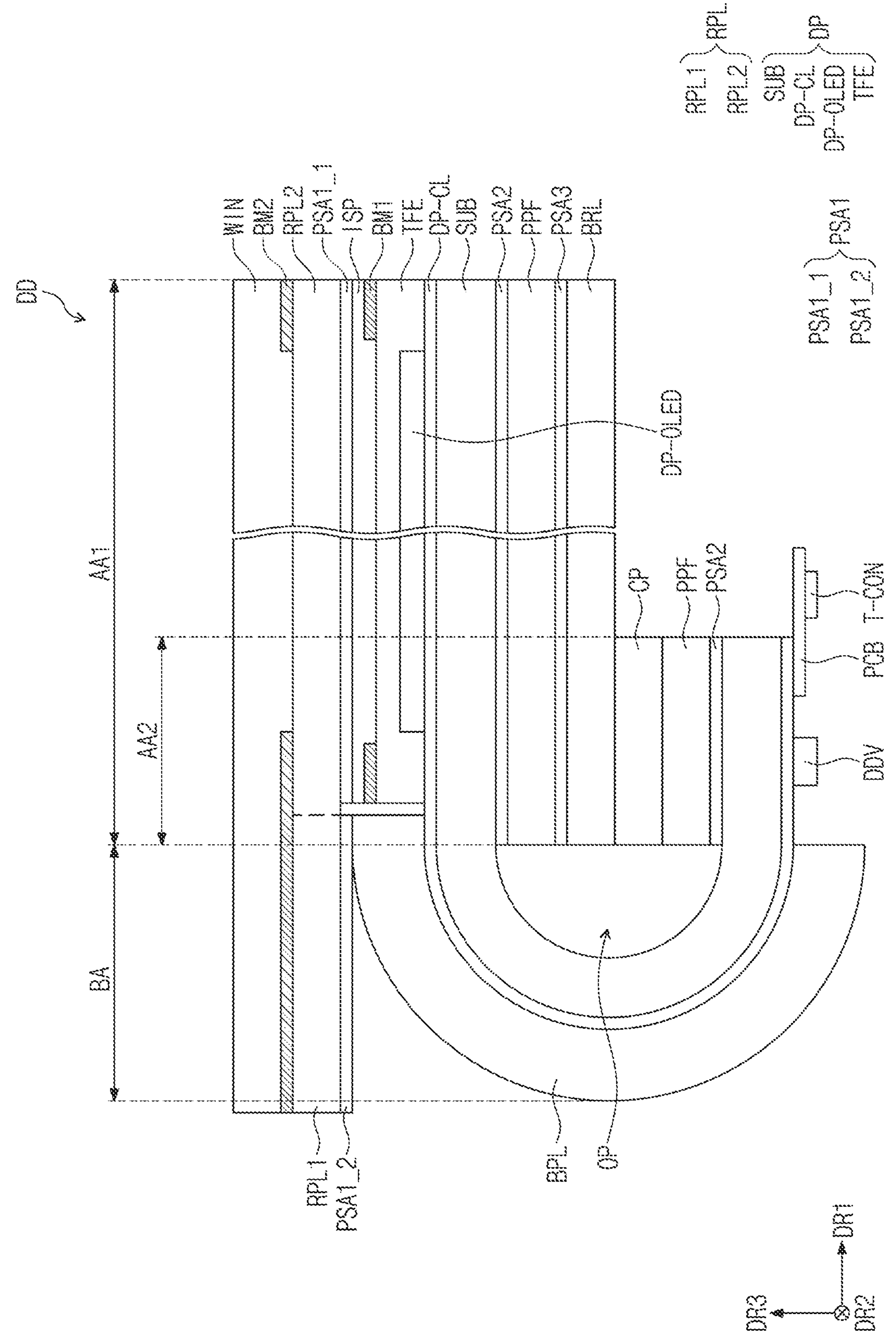

FIGS. 7A to 7C are cross-sectional views taken along a line II-II' of FIG. 5.

FIG. 7B shows a cross-section of a display device DD according to another embodiment of the present disclosure. Therefore, descriptions on the display device DD of FIG. 7B will be focused on different features from those of the display device DD of FIG. 7A.

FIG. 7C shows a bent state of a bending portion BA of FIG. 7A.

A substrate SUB, a circuit element layer DP-CL, a display element layer DP-OLED, a thin film encapsulation layer TFE, an input sensing part ISP, an anti-reflective layer RPL, and a window WIN of FIGS. 7A to 7C may have substantially the same structure and function as those of the substrate SUB, the circuit element layer DP-CL, the display element layer DP-OLED, the thin film encapsulation layer TFE, the input sensing part ISP, the anti-reflective layer RPL, and the window WIN of FIGS. 3 to 6, and thus, details thereof will be omitted or briefly provided below.

Referring to FIG. 7A, the display device DD may further include first and second black matrices BM1 and BM2, a panel protective film PPF, a barrier layer BRL, a bending protective layer BPL and a step difference compensation layer CP.

The circuit element layer DP-CL may be disposed on the substrate SUB. The circuit element layer DP-CL may extend in the first direction DR1 along the substrate SUB.

The display element layer DP-OLED may be disposed on the circuit element layer DP-CL. The thin film encapsulation layer TFE may be disposed on the display element layer DP-OLED and the circuit element layer DP-CL. The thin film encapsulation layer TFE may cover the display element layer DP-OLED.

The first black matrix BM1 may be disposed on the thin film encapsulation layer TFE. The first black matrix BM1 may be disposed adjacent to a boundary of a first portion AA1. As shown in FIG. 5, the first black matrix BM1 may be provided in a single unitary form. The first black matrix BM1 may not overlap the display element layer DP-OLED in a plan view. The display element layer DP-OLED may be disposed between two portions of the first black matrix BM1.

The input sensing part ISP may be disposed in the first portion AA1. The input sensing part ISP may be disposed on the thin film encapsulation layer TFE and the first black matrix BM1. The input sensing part ISP may cover the first black matrix BM1.

The bending protective layer BPL may be disposed in a bending portion BA. The bending protective layer BPL may extend in the first direction DR1 and may be disposed in a boundary of each of the first portion AA1 and a second portion AA2. The bending protective layer BPL may be disposed in the first portion AA1 and the second portion AA2, which are adjacent to the bending portion BA. Opposite ends of the bending protective layer BPL in the first direction DR1 may overlap the first portion AA1 and the second portion AA2, respectively, in a plan view. The bending protective layer BPL may be disposed spaced apart from the thin film encapsulation layer TFE and the input sensing part ISP in the first direction DR1.

A first adhesive layer PSA1 may be disposed on the bending protective layer BPL and the input sensing part ISP. The first adhesive layer PSA1 may include a first_first adhesive layer PSA1_1 and a first_second adhesive layer PSA1_2. The first_first adhesive layer PSA1_1 may be disposed on the input sensing part ISP. The first_first adhesive layer PSA1_1 may be disposed in the first portion AA1. The first_second adhesive layer PSA1_2 may be disposed on the bending protective layer BPL. The first_second adhesive layer PSA1_2 may be disposed in the bending portion BA. The first_second adhesive layer PSA1_2 may be omitted.

This structure will be described in detail with reference to FIGS. 8A and 8B. The first_first adhesive layer PSA1_1 and the first_second adhesive layer PSA1_2 may be spaced apart from each other in the first direction DR1.

The anti-reflective layer RPL may be disposed in the first portion AA1, the second portion AA2, and the bending portion BA. When viewed in the plane, the anti-reflective layer RPL may be disposed in the first portion AA1 and may extend to the bending portion BA and the second portion AA2. When viewed in the plane, the anti-reflective layer RPL may overlap the bending portion BA. When viewed in the plane (e.g., in a plan view), the anti-reflective layer RPL may overlap the boundary of the second portion AA2.

The anti-reflective layer RPL may overlap the display element layer DP-OLED, the thin film encapsulation layer TFE, the input sensing part ISP, and the first black matrix BM1 in a plan view. The anti-reflective layer RPL may cover the first black matrix BM1.

The anti-reflective layer RPL may be disposed on the bending protective layer BPL. The bending protective layer BPL may be disposed between the bending portion BA and the anti-reflective layer RPL. When viewed in the plane, the anti-reflective layer RPL may overlap the bending portion BA and may cover the bending protective layer BPL. The anti-reflective layer RPL and the bending protective layer BPL may be attached to each other by the first_second adhesive layer PSA1_2.

Although not shown in figures, a coating layer may be disposed on an upper surface of the bending protective layer BPL. The coating layer may have a hydrophobicity. Accordingly, an adhesion between the bending protective layer BPL and the first_second adhesive layer PSA1_2 may be weaker than an adhesion between the anti-reflective layer RPL and the first_second adhesive layer PSA1_2.

The anti-reflective layer RPL may include a first anti-reflective layer RPL1 and a second anti-reflective layer RPL2. The first anti-reflective layer RPL1 may be defined as a portion of the anti-reflective layer RPL, which overlaps the bending protective layer BPL in a plan view. The second anti-reflective layer RPL2 may be defined as a portion of the anti-reflective layer RPL, which does not overlap the bending protective layer BPL in a plan view. The first anti-reflective layer RPL1 may be disposed in the bending portion BA. The first anti-reflective layer RPL1 may be disposed in the first portion AA1 and the second portion AA2, which are adjacent to the bending portion BA. The second anti-reflective layer RPL2 may be disposed in the first portion AA1.

The second black matrix BM2 may be disposed on the anti-reflective layer RPL. The second black matrix BM2 may correspond to the peripheral area NAA of FIG. 2. The second black matrix BM2 may be disposed adjacent to a boundary of the anti-reflective layer RPL. A portion of the second black matrix BM2 shown in FIG. 7A, which is adjacent to a left side of the anti-reflective layer RPL, may be disposed in the first portion AA1 and may extend to the bending portion BA and the second portion AA2. The second black matrix BM2 may be disposed in the first portion AA1, the second portion AA2, and the bending portion BA. The second black matrix BM2 may overlap the first portion AA1, the second portion AA2, and the bending portion BA in a plan view. The second black matrix BM2 may be provided substantially in a single unitary form.

The second black matrix BM2 may overlap the first black matrix BM1. When viewed in the plane, the second black matrix BM2 may cover the first black matrix BM1.

The second black matrix BM2 may include a black organic material mixed with a black pigment or chromium oxide (CrOx).

The window WIN may be disposed on the anti-reflective layer RPL and the second black matrix BM2. The window WIN may cover the second black matrix BM2. A lower surface of the window WIN and a lower surface of the second black matrix BM2 may be placed on the same plane. The window WIN may be directly in contact with an upper surface of the anti-reflective layer RPL and an upper surface of the second black matrix BM2. The window WIN may be formed on the upper surface of the anti-reflective layer RPL and the upper surface of the second black matrix BM2 by a coating method. The coating method for the window WIN will be described with reference to FIGS. 9E to 9G.

The window WIN may be disposed in the first portion AA1, the second portion AA2, and the bending portion BA. The window WIN may be disposed in the first portion AA1 and may extend to the bending portion BA and the second portion AA2. When viewed in the plane, the window WIN may overlap the bending portion BA. The window WIN may be disposed in the second portion AA2 adjacent to the bending portion BA. When viewed in the plane, the window WIN may overlap the boundary of the second portion AA2.

The panel protective film PPF may be disposed under the substrate SUB. The panel protective film PPF may be attached to the substrate SUB by a second adhesive layer PSA2. An opening OP may be defined through the panel protective film PPF and may overlap the bending portion BA in a plan view. As an example, the panel protective film PPF may be disposed in the first portion AA1 and the second portion AA2 but may not be disposed in the bending portion BA. When viewed in the plane, after the panel protective film PPF is disposed under the substrate SUB, a portion of the panel protective film PPF, which overlaps the bending portion BA, may be removed, and thus, the opening OP may be formed.

The barrier layer BRL may be disposed under the panel protective film PPF. The barrier layer BRL may be disposed under the panel protective film PPF in the first portion AA1. The barrier layer BRL may be attached to the panel protective film PPF by a third adhesive layer PSA3.

The step difference compensation layer CP may be disposed under the barrier layer BRL. The step difference compensation layer CP may overlap the first portion AA1 in a plan view. The step difference compensation layer CP may be disposed adjacent to a boundary of the barrier layer BRL. As an example, a length in the first direction DR1 of the step difference compensation layer CP may be smaller than a length in the first direction DR1 of the barrier layer BRL.

Although not shown in figures, a digitizer may be disposed under the step difference compensation layer CP. The digitizer may be a device that receives a user-directed position information on a surface thereof. When the user moves a pen on the display device DD, the pen may be driven by an alternating current signal to produce an oscillating magnetic field, and the oscillating magnetic field may induce a signal in coils. The position of the pen may be detected based on the signal induced in the coils. The digitizer may detect the position of the pen by detecting an electromagnetic change caused by the approaching of the pen.

The data driver DDV may be disposed in the second portion AA2 of the display panel DP. The printed circuit board PCB may be connected to the display panel DP. As an example, the printed circuit board PCB may be connected to one side of the second portion AA2. The timing controller T-CON may be disposed on the printed circuit board PCB. The timing controller T-CON may be provided in an integrated circuit chip form and may be mounted on the upper surface of the printed circuit board PCB.

FIG. 7B is a cross-sectional view of the display device DD according to another embodiment of the present disclosure.

Referring to FIG. 7B, an anti-reflective layer RPL may be disposed in a first portion AA1 and a bending portion BA. When viewed in the plane (i.e., in a plan view), the anti-reflective layer RPL may be disposed in the first portion AA1 and may extend to the bending portion BA. When viewed in the plane, the anti-reflective layer RPL may overlap the bending portion BA. The anti-reflective layer RPL may be spaced apart from a boundary of a bending protective layer BPL disposed in a second portion AA2.

A second black matrix BM2 may be disposed on the anti-reflective layer RPL. The second black matrix BM2 may be disposed adjacent to a boundary of the anti-reflective layer RPL. The second black matrix BM2 may be disposed in the first portion AA1 and the bending portion BA. The second black matrix BM2 may overlap the first portion AA1 and the bending portion BA in a plan view. The second black matrix BM2 may be disposed near a boundary of the bending portion BA adjacent to the second portion AA2.

The window WIN may be disposed on the anti-reflective layer RPL and the second black matrix BM2. The window WIN may be disposed in the first portion AA1 and the bending portion BA. When viewed in the plane, the window WIN may be disposed in the first portion AA1 and may extend to the bending portion BA. When viewed in the plane, the window WIN may overlap the bending portion BA. In the plan view, the boundary of the window WIN may be spaced apart from the boundary of the bending protective layer BPL disposed in the second portion AA2.

Referring to FIGS. 7A and 7C, the bending portion BA may be bent to allow the second portion AA2 to be disposed under the first portion AA1. Accordingly, the data driver DDV, the printed circuit board PCB, and the timing controller T-CON may be disposed at a lower portion in the second portion AA2.

When the bending portion BA is bent and the second portion AA2 is disposed under the first portion AA1, a part of the panel protective film PPF disposed at a lower portion in the second portion AA2 before bending may be disposed at an upper portion in the second portion AA2 after bending. The part of the panel protective film PPF disposed at the upper portion in the second portion AA2 may be in contact with the step difference compensation layer CP disposed under the first portion AA1.

The first_second adhesive layer PSA1_2 may be disposed between the anti-reflective layer RPL (e.g., the first anti-reflective layer RPL1) and the bending protective layer BPL. Although not shown in figures, the coating layer may be disposed on the upper surface of the bending protective layer BPL. The coating layer may have the hydrophobicity. Accordingly, the adhesion between the bending protective layer BPL and the first_second adhesive layer PSA1_2 may be weaker than the adhesion between the anti-reflective layer RPL (e.g., the first anti-reflective layer RPL1) and the first_second adhesive layer PSA1_2.

When the bending portion BA is bent and the second portion AA2 is disposed under the first portion AA1, the first_second adhesive layer PSA1_2 may be separated from the bending protective layer BPL. The first_second adhesive layer PSA1_2 may be attached to a lower surface of the anti-reflective layer RPL. Accordingly, the bending protective layer BPL may be separated from the anti-reflective layer RPL and may be bent.

When viewed in the plane, the anti-reflective layer RPL and the window WIN may cover the bending portion BA of display panel DP in the bent state. When viewed in the plane, the anti-reflective layer RPL and the window WIN may cover the bending protective layer BPL. When viewed in the plane, the first anti-reflective layer RPL1 may cover the bent bending protective layer BPL.

In the case where the anti-reflective layer RPL and the window WIN overlap the first portion AA1 and do not overlap the bending portion BA and the second portion AA2 in a plan view, the boundary between the first portion AA1 and the bending portion BA may be perceived by the user from the outside when the bending portion BA is bent.

However, according to the display device DD of the present disclosure, the anti-reflective layer RPL and the window WIN may extend to the bending portion BA. Accordingly, although the bending portion BA is bent, the anti-reflective layer RPL and the window WIN may cover the boundary between the first portion AA1 and the bending portion BA when viewed in the plane (i.e., in a plan view). Thus, the boundary between the first portion AA1 and the bending portion BA may not be perceived from the outside. In addition, the second black matrix BM2 disposed on the anti-reflective layer RPL may extend to the bending portion BA, and thus, the boundary between the first portion AA1 and the bending portion BA may not be perceived by the user from the outside.

Figure 8A:
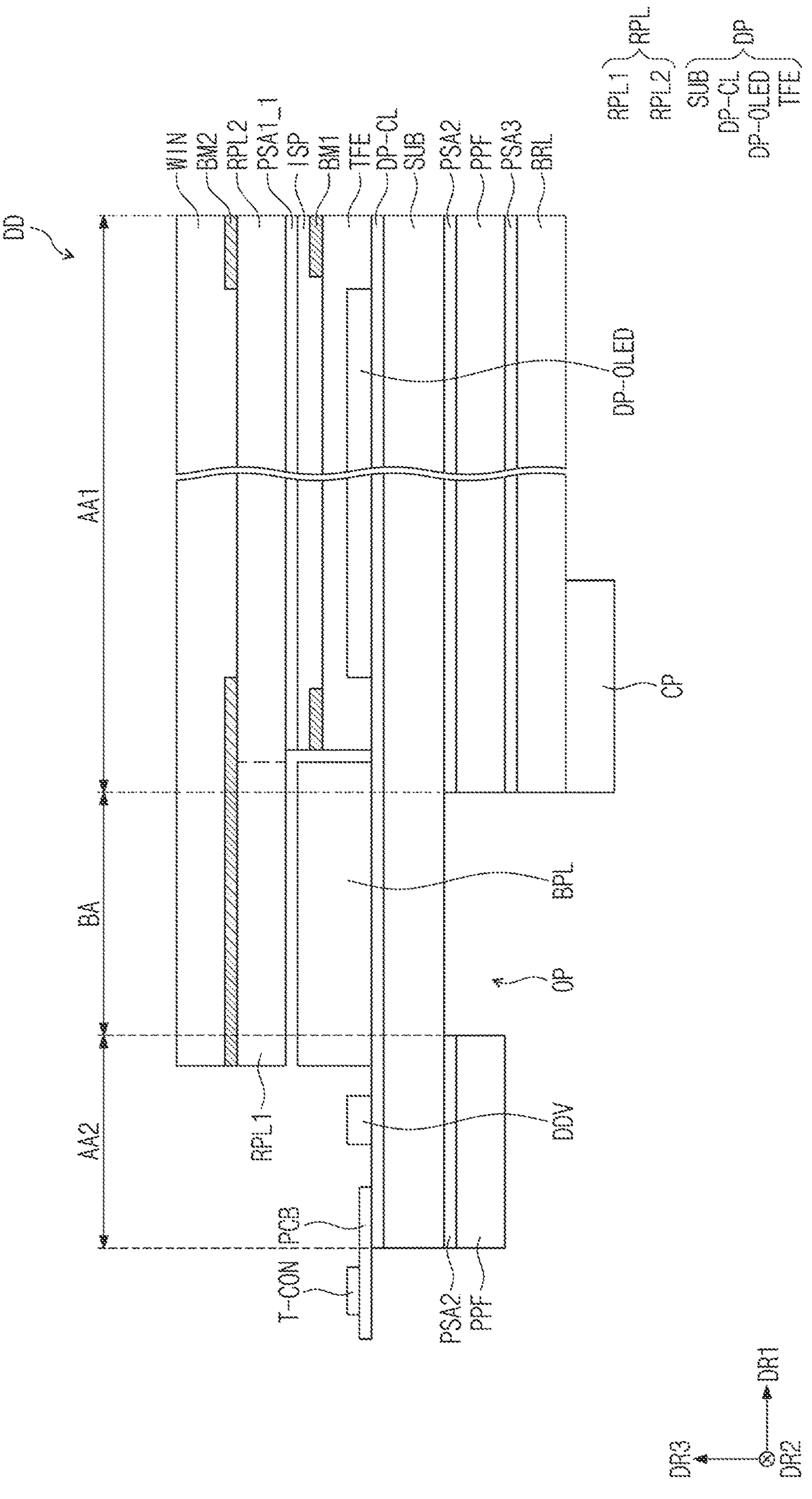
FIGS. 8A and 8B are cross-sectional views of a display device according to an embodiment of the present disclosure.
Figure 8B:
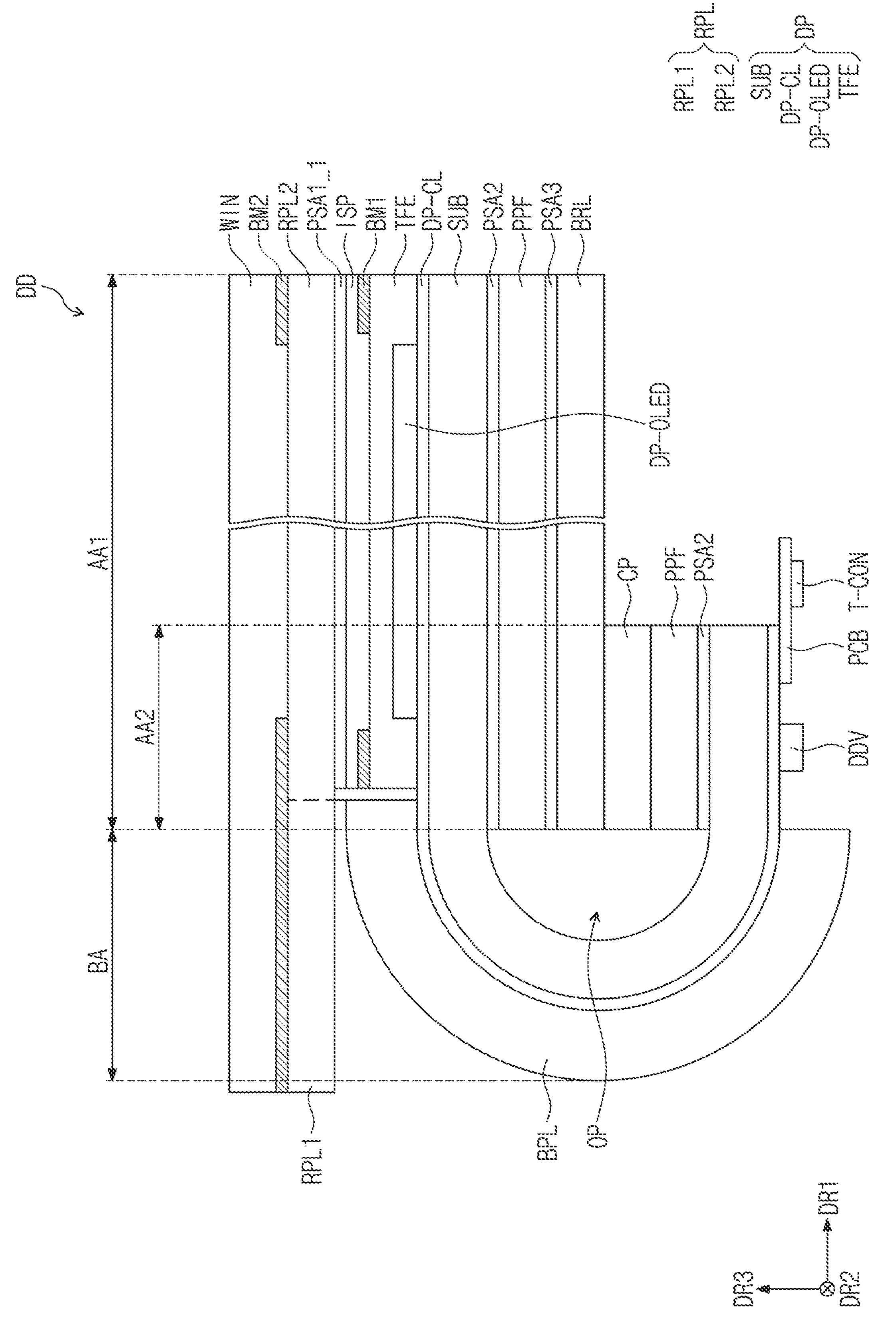

FIGS. 8A and 8B are cross-sectional views of a display device DD according to an embodiment of the present disclosure.

As an example, FIG. 8B shows a cross-section of a bent state of a bending portion BA of FIG. 8A.

A display panel DP, an input sensing part ISP, a bending protective layer BPL, an anti-reflective layer RPL, a window WIN, second and third adhesive layers PSA2 and PSA3, a step difference compensation layer CP, a data driver DDV, a printed circuit board PCB, and a timing controller T-CON of FIGS. 8A and 8B may have substantially the same structure and function as those of the display panel DP, the input sensing part ISP, the bending protective layer BPL, the anti-reflective layer RPL, the window WIN, the second and third adhesive layers PSA2 and PSA3, the step difference compensation layer CP, the data driver DDV, the printed circuit board PCB, and the timing controller T-CON of FIGS. 7A to 7C, and thus, details thereof will be omitted or briefly provided below.

Referring to FIG. 8A, an adhesive layer may not be disposed between the bending protective layer BPL and the anti-reflective layer RPL. In this case, the bending protective layer BPL and a first anti-reflective layer RPL1 may be separated from each other. The bending protective layer BPL and the first anti-reflective layer RPL1 may be separated from each other in the third direction DR3.

Referring to FIG. 8B, the bending portion BA may be bent to allow the second portion AA2 to be disposed under the first portion AA1. As the bending protective layer BPL and the anti-reflective layer RPL are spaced apart from each other, the bending protective layer BPL may be bent.

When viewed in the plane, the anti-reflective layer RPL and the window WIN may cover the bending portion BA of display panel and the bending protective layer BPL. Accordingly, the boundary between the bending portion BA and the first portion AA1 may not be perceived by the user from the outside.

FIGS. 9A to 9H are views illustrating a method of manufacturing the display device DD according to an embodiment of the present disclosure.

A step difference compensation layer CP, a barrier layer BRL, a panel protective film PPF, a display panel DP, an input sensing part ISP, a bending protective layer BPL, a data driver DDV, a printed circuit board PCB, a timing controller T-CON, an anti-reflective layer RPL, a window WIN, first to third adhesive layers PSA1 to PSA3, and first and second black matrices BM1 and BM2 of FIGS. 9A to 9H may have substantially the same structure and function as those of the step difference compensation layer CP, the barrier layer BRL, the panel protective film PPF, the display panel DP, the input sensing part ISP, the bending protective layer BPL, the data driver DDV, the printed circuit board PCB, the timing controller T-CON, the anti-reflective layer RPL, the window WIN, the first to third adhesive layers PSA1 to PSA3, and the first and second black matrices BM1 and BM2 of FIG. 7A, and thus, details thereof will be omitted or briefly provided below.

Figure 9A:
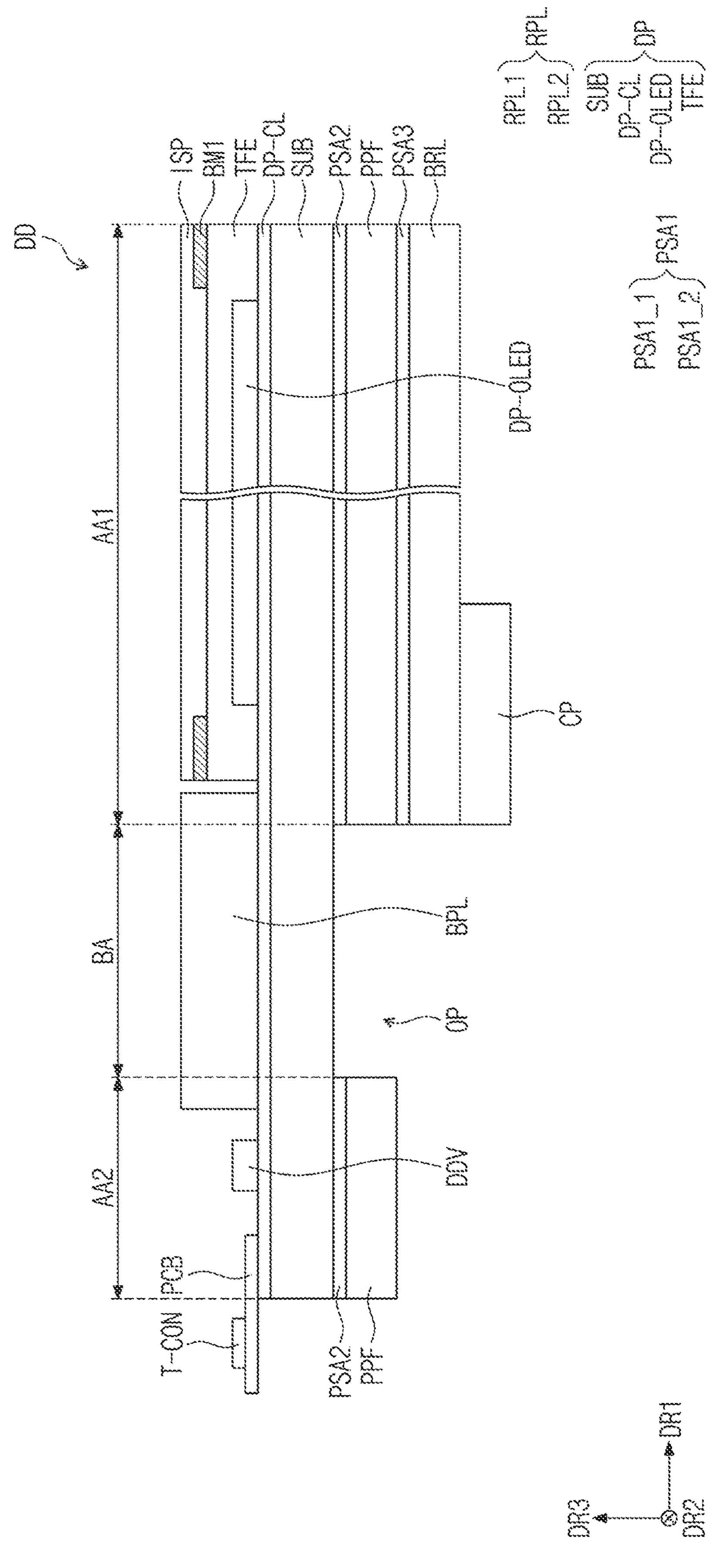
FIGS. 9A to 9H are views illustrating a method of manufacturing a display device according to an embodiment of the present disclosure.
Figure 9B:
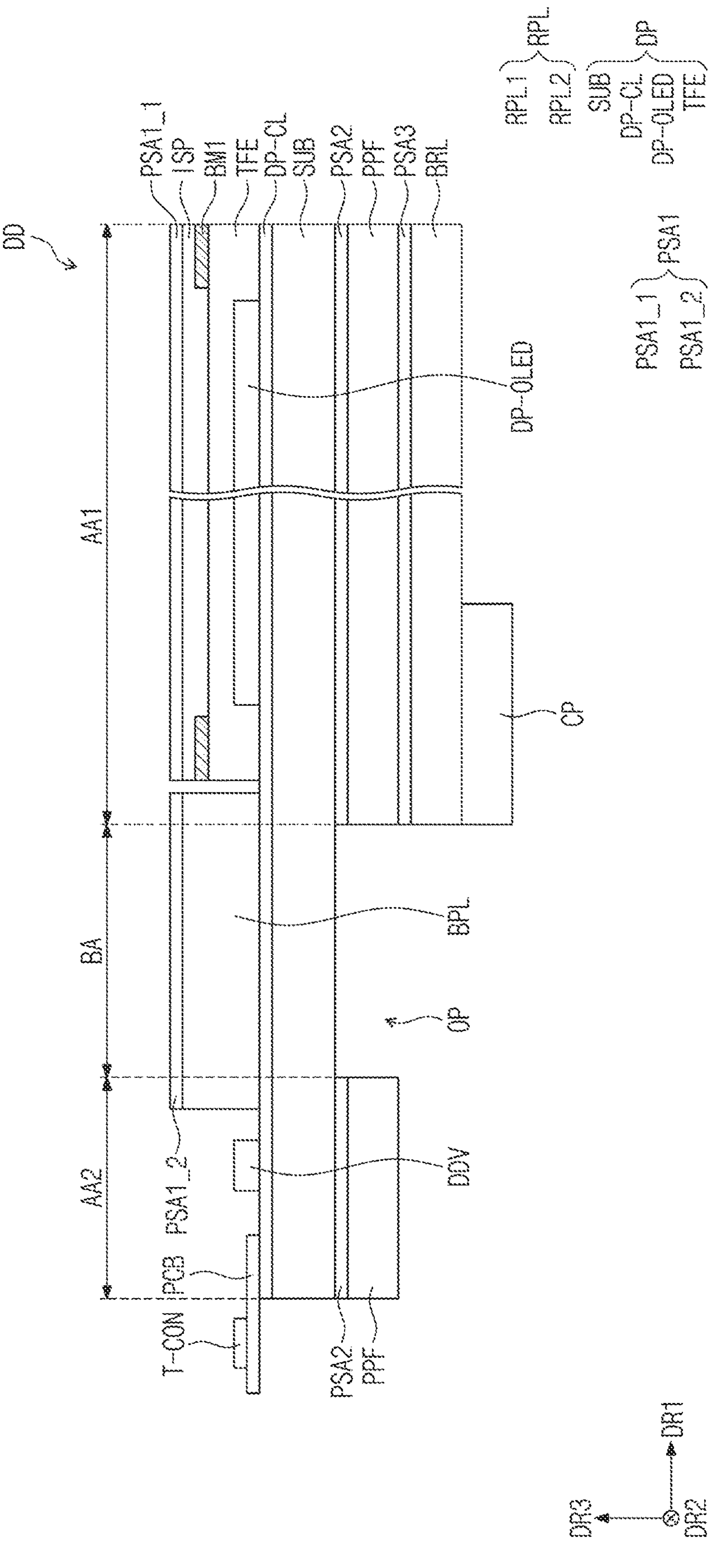

Referring to FIGS. 9A and 9B, the bending protective layer BPL may be disposed in the bending portion BA. Opposite ends of the bending protective layer BPL in the first direction DR1 may extend along the first direction DR1 and may be disposed in the first portion AA1 and the second portion AA2, respectively, which are adjacent to the bending portion BA.

Although not shown in figures, a coating layer may be disposed on the upper surface of the bending protective layer BPL. The coating layer may have the hydrophobicity. Accordingly, an adhesion between a first_second adhesive layer PSA1_2 and the bending protective layer BPL may be weaker than an adhesion between a first_first adhesive layer PSA1_1 and the input sensing part ISP, however, the present disclosure should not be limited thereto or thereby. According to another embodiment, the adhesion of the first_second adhesive layer PSA1_2, which is disposed on the upper surface of the bending protective layer BPL, may be weakened by being carbonized using a laser beam or by a polytetrafluoroethylene coating.

Figure 9C:
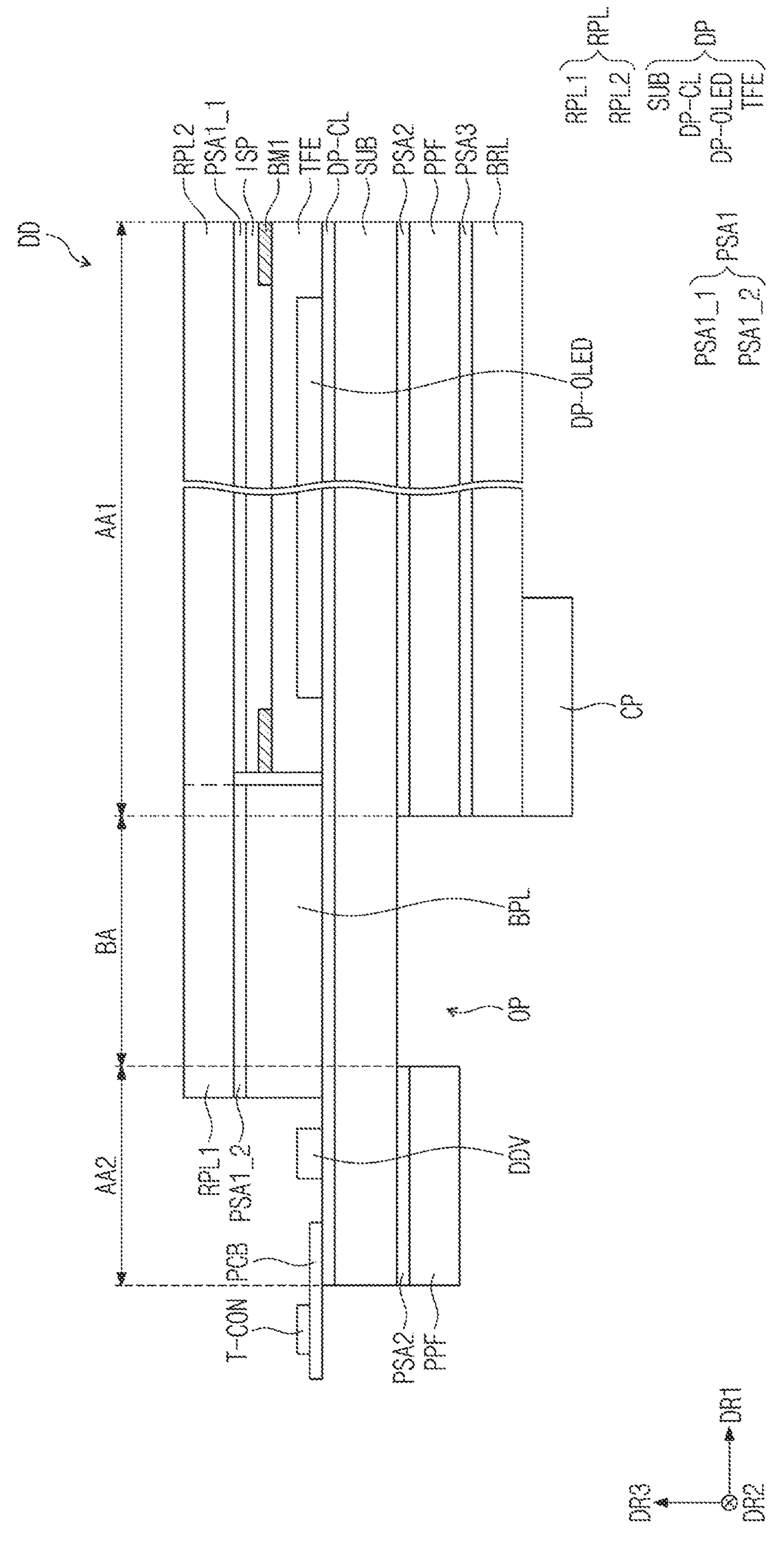

Referring to FIG. 9C, the anti-reflective layer RPL may be disposed in the first portion AA1, the second portion AA2, and the bending portion BA. The anti-reflective layer RPL may include the first anti-reflective layer RPL1 and the second anti-reflective layer RPL2.

The first anti-reflective layer RPL1 may be defined as a portion of the anti-reflective layer RPL, which overlaps the bending protective layer BPL in a plan view. The second anti-reflective layer RPL2 may be defined as a portion of the anti-reflective layer RPL, which does not overlap the bending protective layer BPL in a plan view. The first anti-reflective layer RPL1 may be disposed in the bending portion BA. The first anti-reflective layer RPL1 may be disposed in the first portion AA1 and the second portion AA2, which are adjacent to the bending portion BA. The second anti-reflective layer RPL2 may be disposed in the first portion AA1.

The anti-reflective layer RPL may be attached to the input sensing part ISP by the first_first adhesive layer PSA1_1. The anti-reflective layer RPL may be attached to the bending protective layer BPL by the first_second adhesive layer PSA1_2.

Figure 9D:
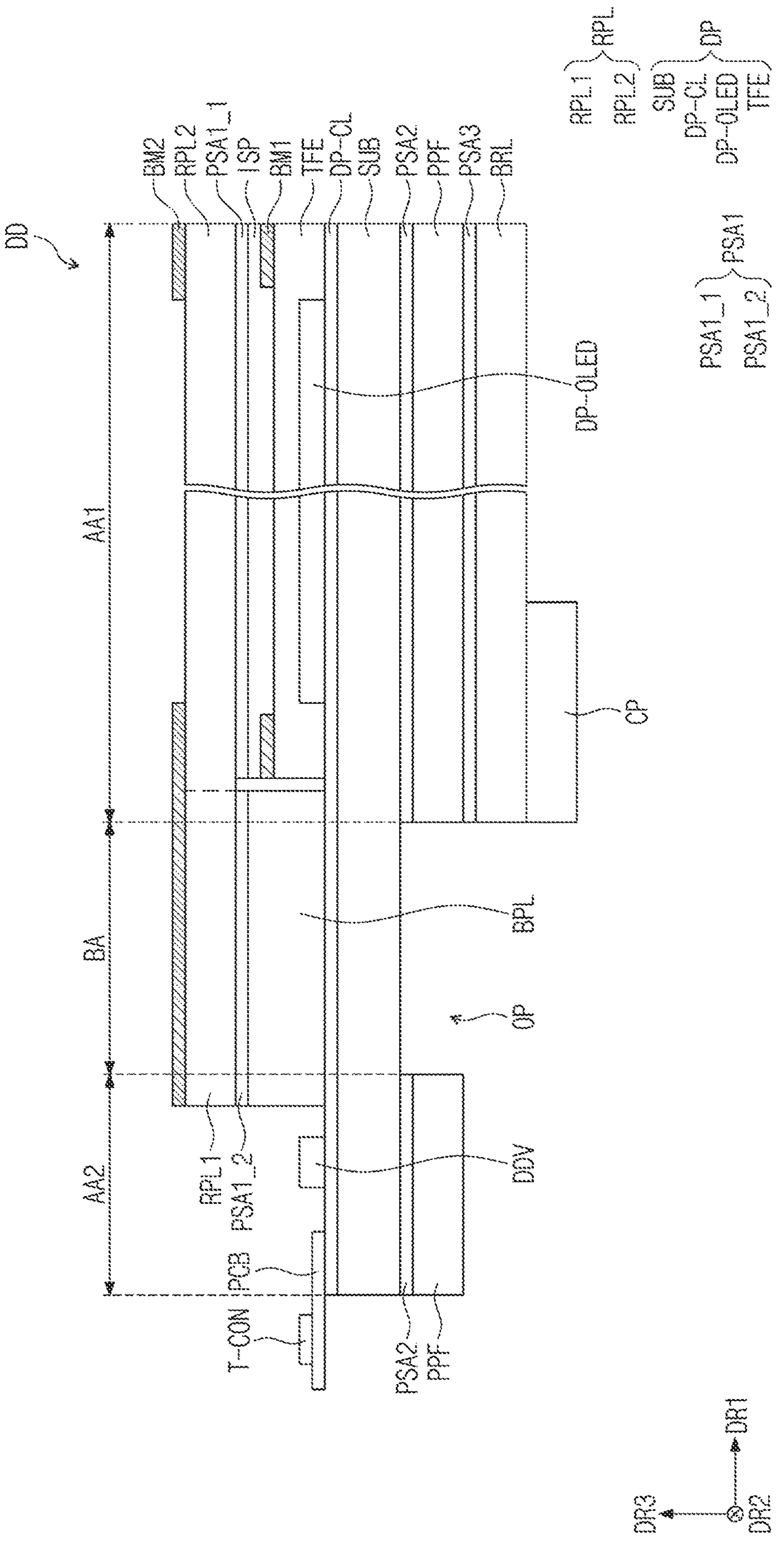

Referring to FIG. 9D, the second black matrix BM2 may be disposed on the anti-reflective layer RPL. The second black matrix BM2 may be printed by an inkjet method or a silk-screen method.

The second black matrix BM2 may be disposed in the first portion AA1. The second black matrix BM2 may be disposed in the first portion AA1 and may extend to the bending portion BA. When viewed in plane, the second black matrix BM2 may cover the first black matrix BM1. When viewed in plane, the second black matrix BM2 may cover the bending portion BA of the display panel DP. The second black matrix BM2 may be disposed in the second portion AA2. The second black matrix BM2 may be disposed in the boundary of the second portion AA2 adjacent to the bending portion BA.

Figure 9E:
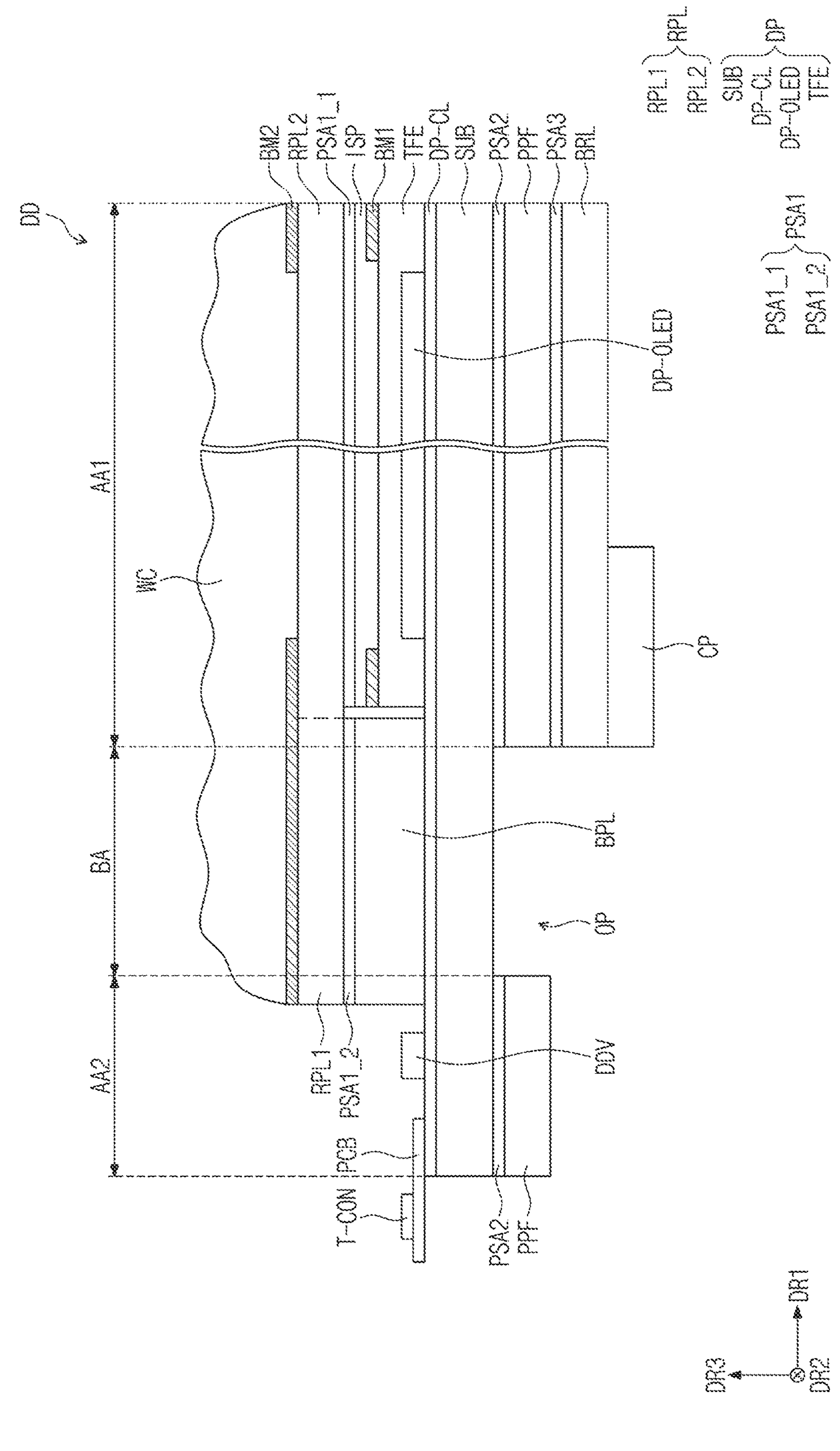

Referring to FIG. 9E, a window coating material WC may be provided on the anti-reflective layer RPL and the second black matrix BM2. The window coating material WC may cover the second black matrix BM2. The window coating material WC may cover the upper surface of the anti-reflective layer RPL. The window coating material WC may be directly provided on the anti-reflective layer RPL and the second black matrix BM2. As an example, the window coating material WC may be provided by a roll coating, silk-screen coating, spray coating, or slit coating method, however, the present disclosure should not be limited thereto or thereby. The window coating material WC may be provided in various ways.

As the window coating material WC is disposed directly on the anti-reflective layer RPL and the second black matrix BM2 without the adhesive layer, a thickness of the display device DD may be reduced. The window coating material WC may include a thermoset, such as polyurethane, urethane acrylate, silicone, etc. The window coating material WC may be cured, and thus, a window coating layer may be formed. The window coating material WC may include a material mixed with the thermoset. However, the material for the window coating material WC should not be limited thereto or thereby, and the window coating material WC may further include various materials.

Figure 9F:
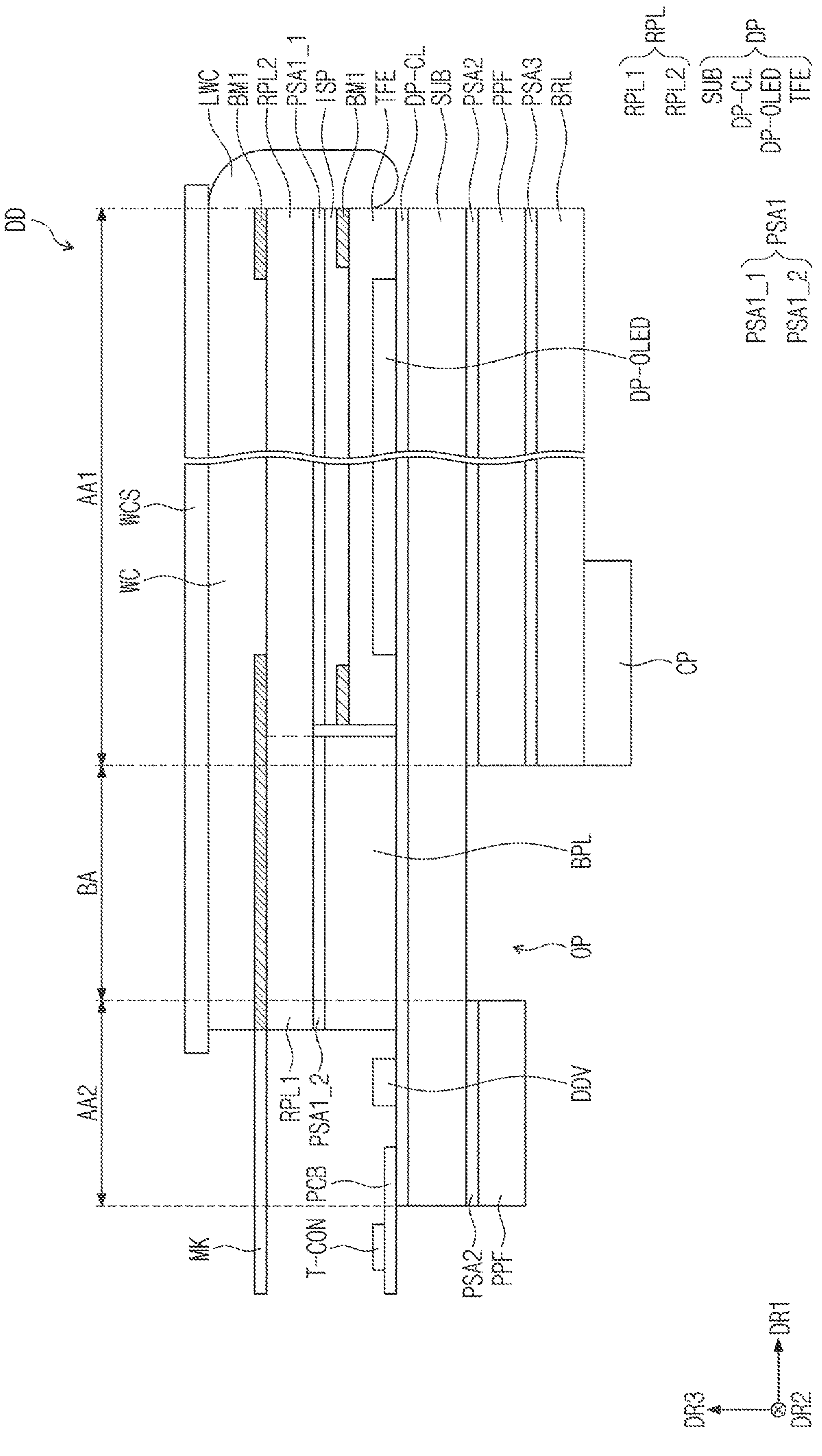

Referring to FIG. 9F, a release glass WCS may be disposed on the window coating material WC. A width in the first direction DR1 of the release glass WCS may be greater than a width in the first direction DR1 of the anti-reflective layer RPL. Although not shown in figures, a lower surface of the release glass WCS may be a plane defined by the first direction DR1 and the second direction DR2. Although not shown in figures, the release glass WCS may include a coating layer. The coating layer may be disposed on the lower surface of the release glass WCS.

A mask MK may be disposed in the second portion AA2. The mask MK may overlap the data driver DDV, the printed circuit board PCB, and the timing controller T-CON. When viewed in the plane, the mask MK may cover the data driver DDV, the printed circuit board PCB, and the timing controller T-CON.

When the mask MK is disposed in the second portion AA2, the release glass WCS may move to the window coating material WC in the third direction DR3. The release glass WCS may press the window coating material WC disposed on the upper surface of the anti-reflective layer RPL and the second black matrix BM2. The window coating material WC may be flattened by the release glass WCS. A portion of the window coating material WC may overflow and may be exposed to the outside of the display device DD. As an example, the portion of the window coating material WC may overflow outside the boundary of first portion AA1 and may be exposed to the outside.

Hereinafter, the window coating material WC exposed outside the display device DD may be defined as a residual coating material LWC. In FIG. 9F, the residual coating material LWC may be exposed to the outside in one side of the display device DD. The one side of the display device DD may be opposite to the other side where the data driver DDV is disposed in the display device DD. As an example, the residual coating material LWC is exposed to the outside in the one side of the display device DD as shown in FIG. 9F, however, the residual coating material LWC may be provided along the boundary of the display device DD in which the data driver DDV of the display device DD is not disposed. The mask MK may be disposed in the second portion AA2 in which the data driver DDV is disposed, and the mask MK may block the window coating material WC to prevent the window coating material WC from overflowing into the second portion AA2. The mask MK may prevent the window coating material WC from overflowing into the data driver DDV, the printed circuit board PCB, and the timing controller T-CON.

Figure 9G:
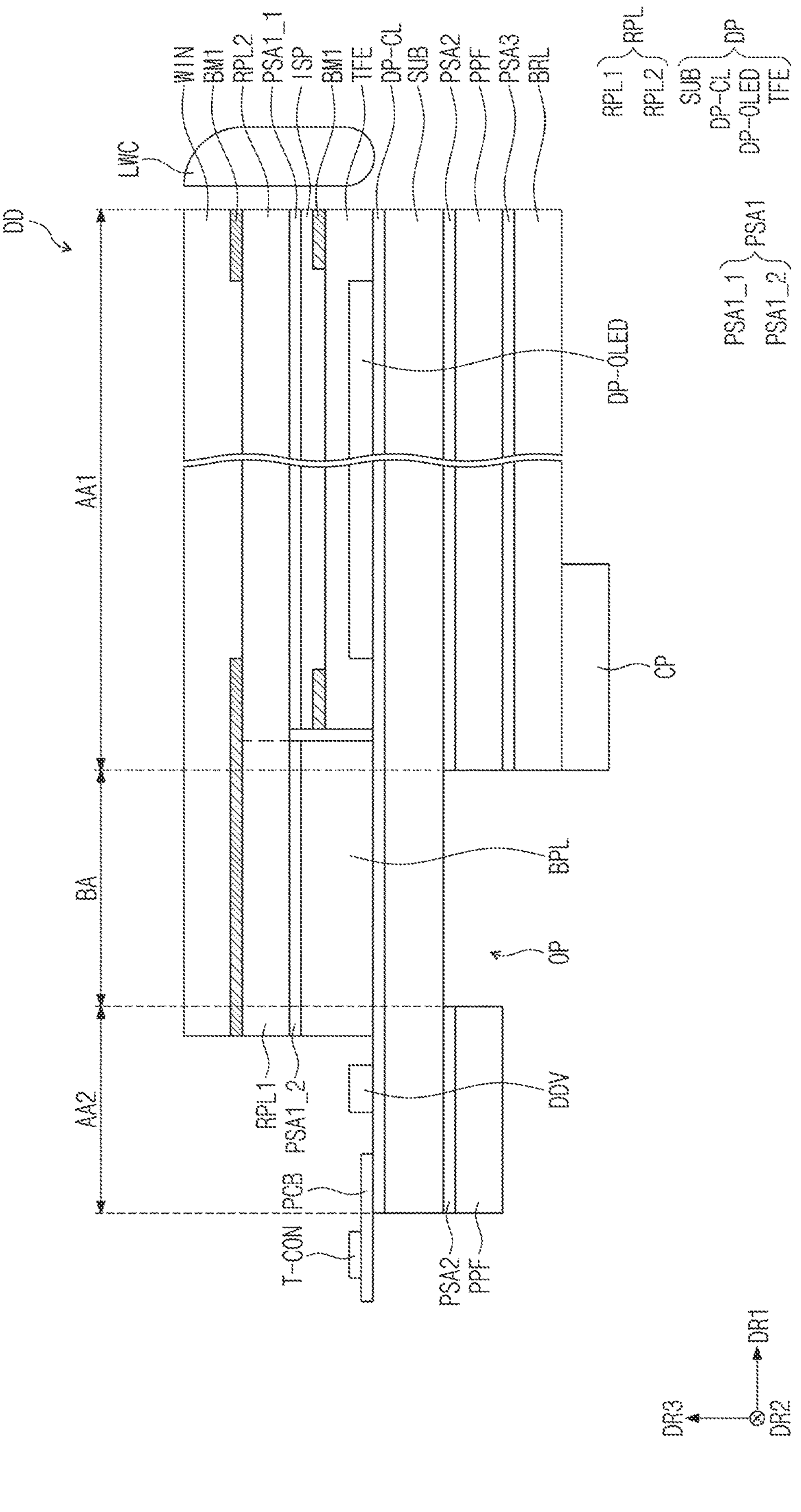

Referring to FIG. 9G, the window coating material WC may be cured. As an example, the window coating material WC may be cured by a heat or ultraviolet ray.

When the window coating material WC is cured, the residual coating material LWC may be removed. As an example, the residual coating material LWC may be removed by using a laser beam or a physical force.

Figure 9H:
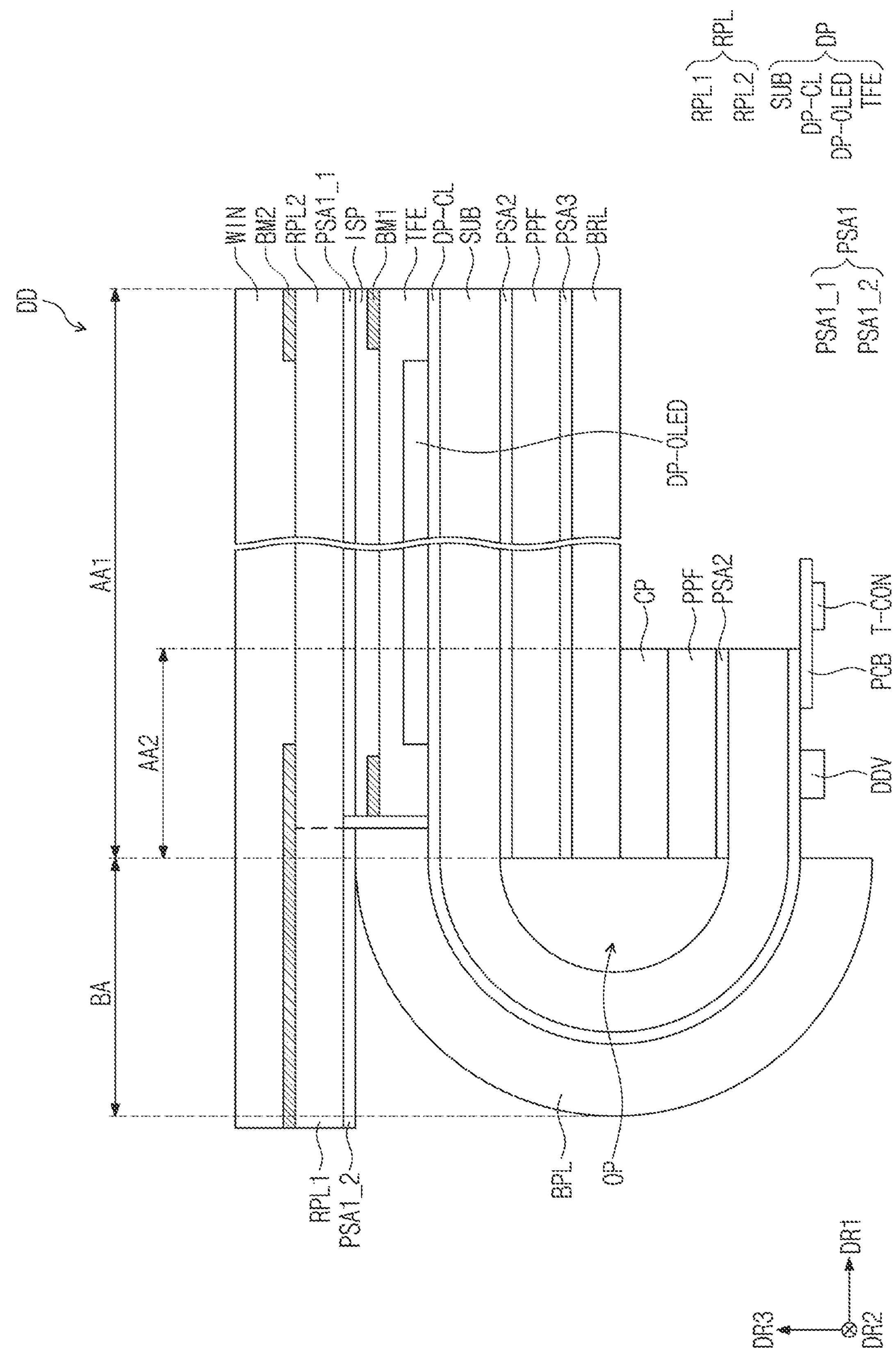

Referring to FIG. 9H, the bending portion BA may be bent after the window WIN is disposed on the anti-reflective layer RPL and the second black matrix BM2. As the bending portion BA is bent, the second portion AA2 may be disposed under the first portion AA1.

The adhesion between the first_second adhesive layer PSA1_2 and the bending protective layer BPL may be weaker than the adhesion between the first_second adhesive layer PSA1_2 and the first anti-reflective layer RPL1. Accordingly, when the bending portion BA is bent, the bending protective layer BPL may be separated from the first_second adhesive layer PSA1_2. Thus, the bending protective layer BPL may be separated from the first anti-reflective layer RPL1.

When viewed in the plane, the anti-reflective layer RPL and the window WIN may cover the bending portion BA of the display panel DP. When viewed in the plane, the anti-reflective layer RPL and the window WIN may cover the bending protective layer BPL. When viewed in the plane, the second black matrix BM2 may cover the first black matrix BM1, the bending protective layer BPL, and the bending portion BA of the display panel DP. Accordingly, the boundary between the bending portion BA and the first portion AA1 may be prevented from being perceived by the user from the outside.

In addition, as the anti-reflective layer RPL extends to overlap the bending portion BA in a plan view, the area of the window WIN coated on the anti-reflective layer RPL may increase.

Figure 10A:
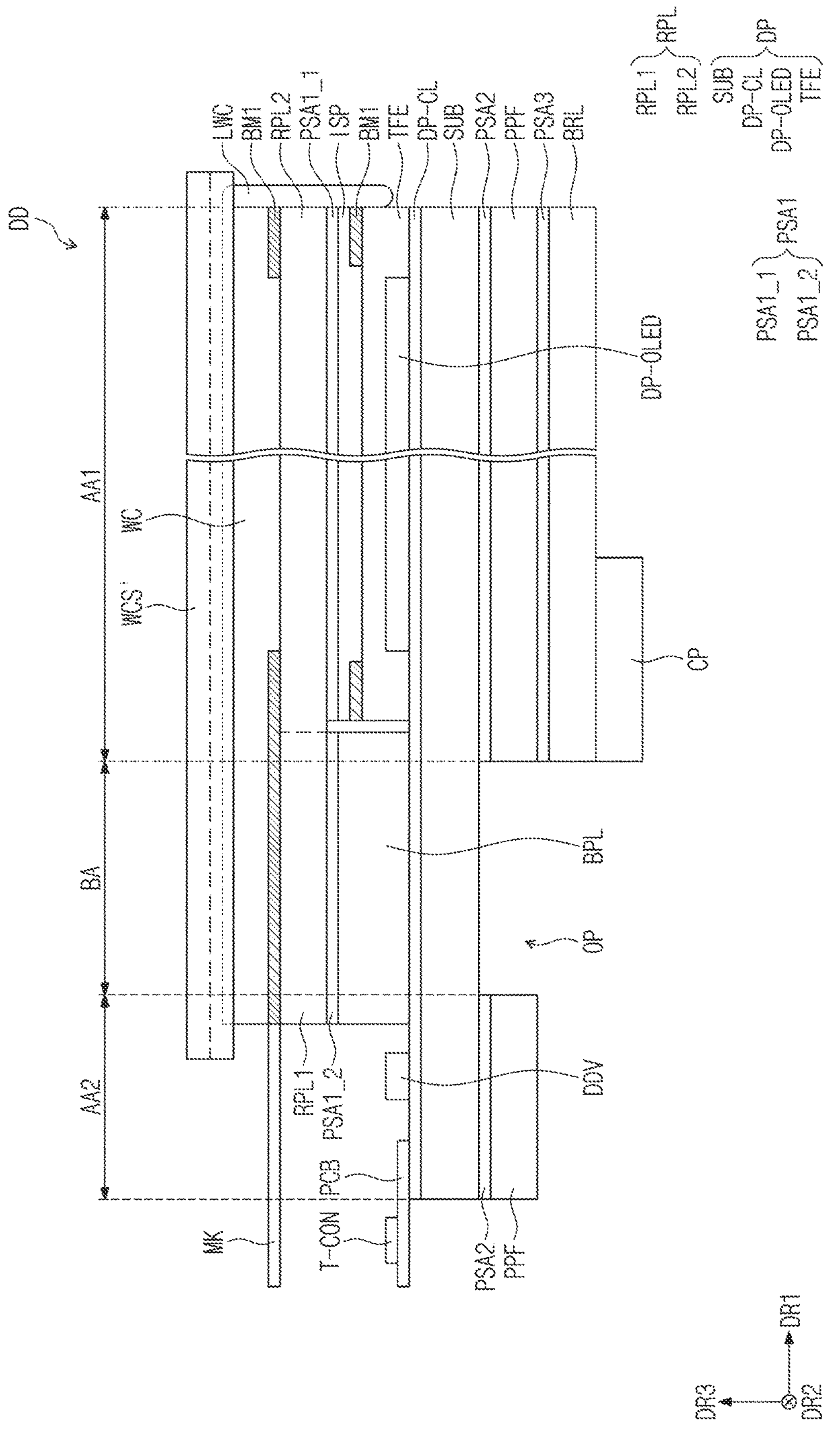
FIGS. 10A and 10B are views illustrating a method of manufacturing a display device according to an embodiment of the present disclosure.
Figure 10B:
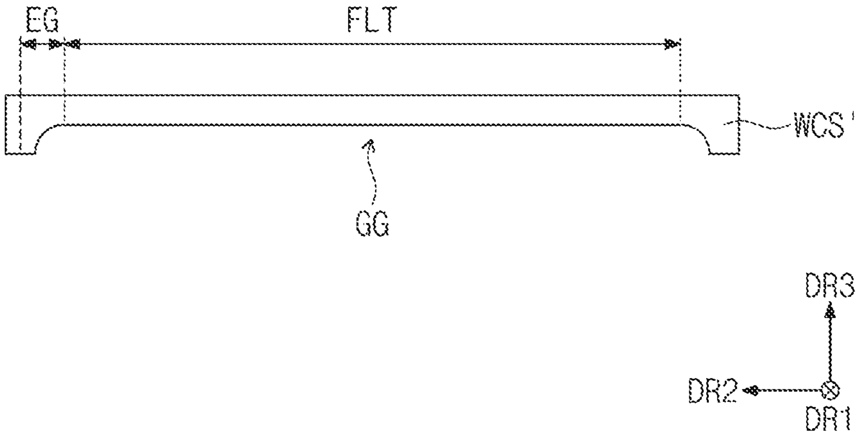

FIGS. 10A and 10B are views illustrating a method of manufacturing a display device DD according to an embodiment of the present disclosure.

In FIGS. 10A and 10B, descriptions of the manufacturing method of the display device DD will be focused on features different from those of the manufacturing method of the display device DD of FIGS. 9A to 9H.

FIGS. 10A and 10B are cross-sectional views taken along a line II-II' of FIG. 5.

A step difference compensation layer CP, a barrier layer BRL, a panel protective film PPF, a display panel DP, an input sensing part ISP, a bending protective layer BPL, a data driver DDV, a printed circuit board PCB, a timing controller T-CON, an anti-reflective layer RPL, a window WIN, first to third adhesive layers PSA1 to PSA3, and first and second black matrices BM1 and BM2 of FIGS. 10A and 10B may have substantially the same structure and function as those of the step difference compensation layer CP, the barrier layer BRL, the panel protective film PPF, the display panel DP, the input sensing part ISP, the bending protective layer BPL, the data driver DDV, the printed circuit board PCB, the timing controller T-CON, the anti-reflective layer RPL, the window WIN, the first to third adhesive layers PSA1 to PSA3, and the first and second black matrices BM1 and BM2 of FIG. 7A, and thus, details thereof will be omitted or briefly provided below.

Referring to FIGS. 10A and 10B, a release glass WCS' may be disposed on a window coating material WC. A lower surface of the release glass WCS' may include a flat portion FLT and edge portions EG. The flat portion FLT may be a plane defined by the first direction DR1 and the second direction DR2. The edge portions EG may extend from the flat portion FLT and may have a concave downward shape with respect to an upper surface of the release glass WCS'. The edge portions EG may extend in the first direction DR1.

Although not shown in figures, the release glass WCS' may move to the third direction DR3 and may be in contact with the window coating material WC. The window coating material WC may have a shape corresponding to the lower surface of the release glass WCS'.

Figure 11:
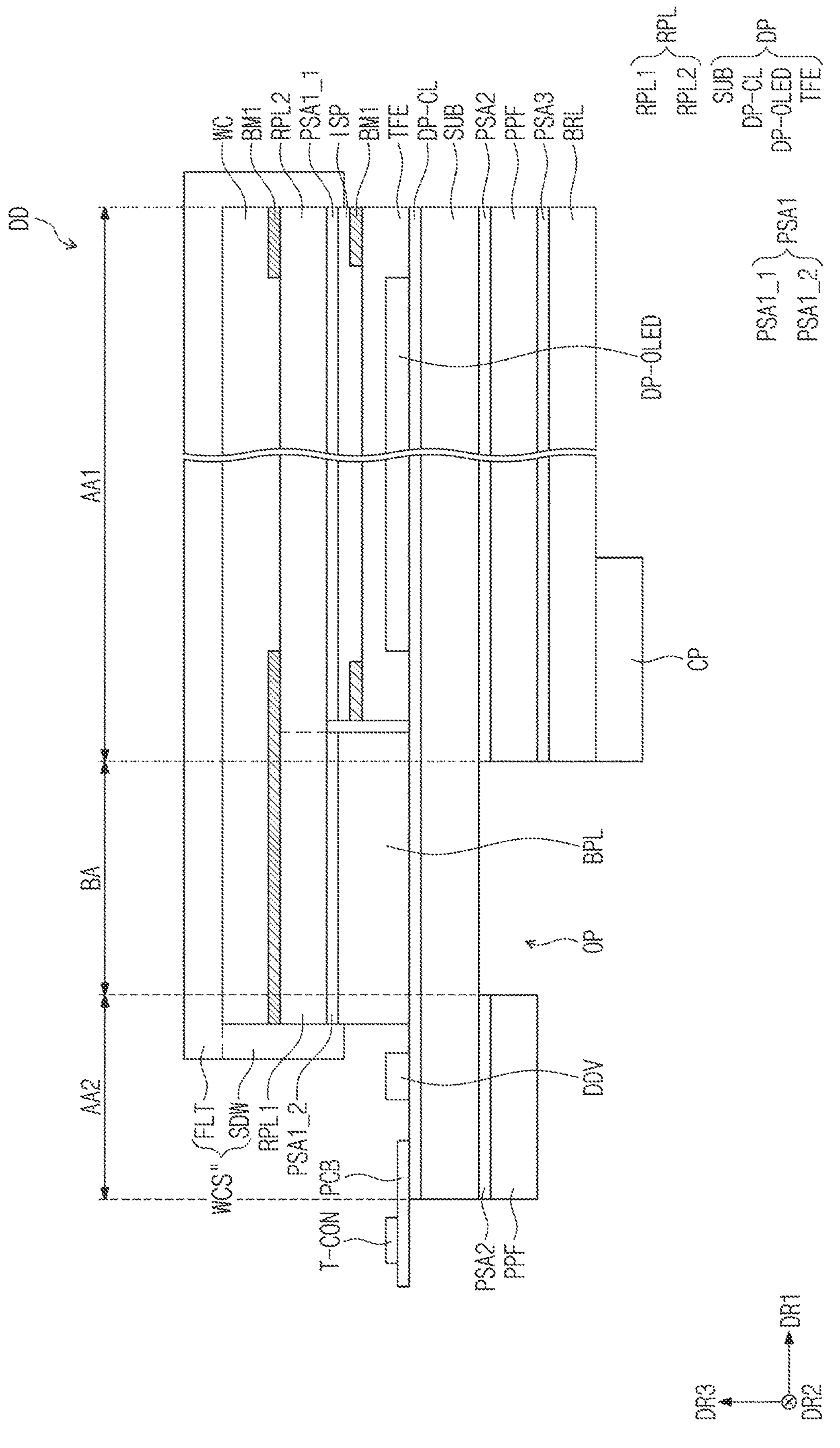
FIG. 11 is a view illustrating a method of manufacturing a display device according to an embodiment of the present disclosure.

FIG. 11 is a view illustrating a method of manufacturing a display device DD according to an embodiment of the present disclosure.

In FIG. 11, descriptions of the display device DD will be focused on features different from those of the display device DD of FIGS. 9A to 9H.

FIG. 11 shows a cross-section taken along a line II-II' of FIG. 5.

A step difference compensation layer CP, a barrier layer BRL, a panel protective film PPF, a display panel DP, an input sensing part ISP, a bending protective layer BPL, a data driver DDV, a printed circuit board PCB, a timing controller T-CON, an anti-reflective layer RPL, a window WIN, first to third adhesive layers PSA1 to PSA3, and first and second black matrices BM1 and BM2 of FIG. 11 may have substantially the same structure and function as those of the step difference compensation layer CP, the barrier layer BRL, the panel protective film PPF, the display panel DP, the input sensing part ISP, the bending protective layer BPL, the data driver DDV, the printed circuit board PCB, the timing controller T-CON, the anti-reflective layer RPL, the window WIN, the first to third adhesive layers PSA1 to PSA3, and the first and second black matrices BM1 and BM2 of FIG. 7A, and thus, details thereof will be omitted or briefly provided below.

Referring to FIG. 11, a release glass WCS" may include a flat portion FLT and sidewall portions SDW. The flat portion FLT may be a plane defined by the first direction DR1 and the second direction DR2. As an example, the sidewall portions SDW may extend from both sides of the flat portion FLT, which are opposite to each other in the first direction DR1, to the third direction DR3. The flat portion FLT and the sidewall portions SDW may be provided integrally with each other.

The release glass WCS" may be disposed on a window coating material WC. The release glass WCS" may move to the third direction DR3 and may press the window coating material WC. The release glass WCS" may surround the window coating material WC. Accordingly, the residual coating material LWC shown in FIG. 9F may not be generated.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present invention shall be determined according to the attached claims.

What is claimed is:

1. A display device comprising:

a display panel comprising a first portion including a display area, a second portion, and a bending portion disposed between the first portion and the second portion, wherein the second portion and the bending portion are disposed in a non-display area adjacent to the display area;

a first black matrix disposed in the first portion and disposed adjacent to a boundary of the first portion;

an anti-reflective layer disposed in the first portion to cover the first black matrix and extending to the bending portion;

a second black matrix disposed on the anti-reflective layer, disposed adjacent to a boundary of the anti-reflective layer, and entirely overlapping the first black matrix and the bending portion in a plan view; and a window disposed on the anti-reflective layer to cover the second black matrix.

2. The display device of claim 1, wherein the window and the anti-reflective layer overlap the bending portion in the plan view.

3. The display device of claim 1, wherein the window is coated on an upper surface of the anti-reflective layer and an upper surface of the second black matrix.

4. The display device of claim 3, wherein the window is directly in contact with the upper surface of the anti-reflective layer and the upper surface of the second black matrix.

5. The display device of claim 1, wherein a lower surface of the window and a lower surface of the second black matrix are placed on a same plane.

6. The display device of claim 1, further comprising a bending protective layer disposed between the bending portion of the display panel and the anti-reflective layer.

7. The display device of claim 6, wherein the bending protective layer, the anti-reflective layer, and the window are further disposed in a portion of the second portion, which is adjacent to the bending portion when the bending portion is not bent.

8. The display device of claim 6, wherein the bending protective layer is further disposed in a portion of the second portion, which is adjacent to the bending portion, and boundaries of the anti-reflective layer and the window are spaced apart from a boundary of the bending protective layer disposed in the second portion in the plan view.

9. The display device of claim 6, further comprising an adhesive layer disposed between the bending protective layer and the anti-reflective layer.

10. The display device of claim 9, wherein the bending protective layer is separated from the anti-reflective layer when the bending portion is bent such that the second portion is disposed under the first portion.

11. The display device of claim 10, wherein the window and the anti-reflective layer cover the bending portion that is bent in the plan view.

12. The display device of claim 10, further comprising a coating layer coated on an upper surface of the bending protective layer, wherein the coating layer has a hydrophobicity.

13. The display device of claim 10, wherein the adhesive layer is spaced apart from the bending protective layer when the bending portion is bent such that the second portion is disposed under the first portion.

14. The display device of claim 6, further comprising an adhesive layer disposed between the display panel and the anti-reflective layer in the first portion, wherein an adhesive layer is not disposed between the bending protective layer and the anti-reflective layer.

15. A display device comprising:

a display panel comprising a first portion including a display area, a second portion, and a bending portion disposed between the first portion and the second portion wherein the second portion and the bending portion are disposed in a non-display area adjacent to the display area;

an anti-reflective layer disposed in the first portion and extending to the bending portion;

a window disposed on the anti-reflective layer;

a bending protective layer disposed between the anti-reflective layer and the bending portion of the display panel and spaced apart from the display area; and an adhesive layer disposed between the bending protective layer and the anti-reflective layer, wherein the bending protective layer is separated from the anti-reflective layer when the bending portion is bent such that the second portion is disposed under the first portion.

16. The display device of claim 15, further comprising a coating layer disposed on an upper surface of the bending protective layer, wherein the coating layer has a hydrophobicity.

* * * * *